US007655156B2

(12) United States Patent
Cheng et al.

(10) Patent No.: US 7,655,156 B2
(45) Date of Patent: Feb. 2, 2010

(54) SILICATE-BASED ORANGE PHOSPHORS

(75) Inventors: Shifan Cheng, Dublin, CA (US); Dejie Tao, Fremont, CA (US); Yi Dong, Tracy, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 217 days.

(21) Appl. No.: 11/258,679

(22) Filed: Oct. 25, 2005

(65) Prior Publication Data

US 2007/0029526 A1 Feb. 8, 2007

Related U.S. Application Data

(60) Provisional application No. 60/705,693, filed on Aug. 3, 2005.

(51) Int. Cl.
  *C09K 11/59* (2006.01)
  *C09K 11/55* (2006.01)
  *C09K 11/61* (2006.01)
  *H01L 33/00* (2006.01)
(52) U.S. Cl. .................. 252/301.4 F; 252/301.6 F; 313/503; 257/98
(58) Field of Classification Search ........... 252/301.4 F, 252/301.6 F; 313/503; 257/98
  See application file for complete search history.

(56) References Cited

U.S. PATENT DOCUMENTS

2006/0027786 A1 2/2006 Dong et al.

2006/0028122 A1 2/2006 Wang et al.
2006/0158090 A1 7/2006 Wang et al.

FOREIGN PATENT DOCUMENTS

| JP | 2005-068269 A | 3/2005 |
| WO | WO 2006/043745 | * 4/2007 |
| WO | WO 2004/085570 | * 10/2007 |

OTHER PUBLICATIONS

Shigeo Shionoya, William M. Yen, et al. "Phosphor Handbook", Edited under the Auspices of Phosphor Research Society, pp. 393, 418, 419 and 421, 1999.
G. Blasse and A. Brill, "Fluorescence of $Eu^{2+}$-Activated Alkaline-Earth Aluminates", Philips Res. Repts. 23, pp. 201-206, 1968.

* cited by examiner

*Primary Examiner*—C. Melissa Koslow
(74) *Attorney, Agent, or Firm*—Fliesler Meyer LLP

(57) ABSTRACT

Novel orange phosphors are disclosed having the comprise silicate-based compounds having the formula $(Sr,A_1)_x(Si,A_2)(O,A_3)_{2+x}:Eu^{2+}$, where $A_1$ is at least one divalent cation (a 2+ ion) including Mg, Ca, Ba, or Zn, or a combination of 1+ and 3+ cations; $A_2$ is a 3+, 4+, or 5+ cation, including at least one of B, Al, Ga, C, Ge, P; $A_3$ is a 1−, 2−, or 3− anion, including F, Cl, and Br; and x is any value between 2.5 and 3.5, inclusive. The formula is written to indicate that the $A_1$ cation replaces Sr; the $A_2$ cation replaces Si, and the $A_3$ anion replaces O. These orange phosphors are configured to emit visible light having a peak emission wavelength greater than about 565 nm. They have applications in white LED illumination systems, plasma display panels, and in orange and other colored LED systems.

26 Claims, 17 Drawing Sheets

| SAMPLE | LED | x | y | Ra | Rall | A | B | C | G2 |
|---|---|---|---|---|---|---|---|---|---|
| #1 | 450nm | 0.292 | 0.217 | | | | 95% | 5% | |
| #2 | 450nm | 0.328 | 0.198 | | | | 7% | 93% | |
| #3 | 450nm | 0.389 | 0.289 | 48.0 | 25.8 | | 62% | 38% | |
| #4 | 450nm | 0.422 | 0.353 | 59.8 | 45.9 | | 82% | 18% | |
| #5 | 450nm | 0.459 | 0.383 | 82.1 | 73.6 | | 78% | 22% | |
| #6 | 450nm | 0.303 | 0.309 | 83.5 | 77.3 | | | 15% | 85% |
| #7 | 460nm | 0.307 | 0.315 | 73.7 | 62.5 | | | 22% | 78% |
| #8 | 460nm | 0.310 | 0.307 | 73.7 | 62.5 | 90% | | 10% | |
| #9 | 460nm | 0.450 | 0.401 | 68.5 | 57.2 | 70% | | 30% | |

G2: (Ba$_{0.7}$Sr$_{0.3}$)$_2$SiO$_4$:EuF (GREEN)
A: (Ba$_{0.3}$Sr$_{0.7}$)$_3$SiO$_5$:EuF (560 YELLOW)
B: (Ba$_{0.075}$Mg$_{0.025}$Sr$_{0.9}$)$_3$SiO$_5$:EuF (570 YELLOW)
C: (Sr$_{0.9}$Ba$_{0.9}$)$_3$SiO$_5$:EuF (ORANGE)

FIG. 13

SILICATE-BASED ORANGE PHOSPHORS

REFERENCE TO RELATED APPLICATION

The present application claims the benefit of U.S. Provisional Application No. 60/705,693, titled "Novel Silicate-Based Orange Phosphors," and filed Aug. 3, 2005. U.S. Provisional Application No. 60/705,693 is hereby incorporated herein by reference in its entirety.

FIELD OF THE INVENTION

Embodiments of the present invention are directed in general to the fluorescence of $Eu^{2+}$-activated silicates configured to emit in the orange region of the spectrum for use in colored LEDs, and white light illumination systems (e.g., white light emitting diodes). In particular, the orange phosphors of the present invention comprise silicate-based compounds having the formula $(Sr,A_1)_x(Si,A_2)(O,A_3)_{2+x}:Eu^{2+}$, where $A_1$ is at least one divalent cation (a 2+ ion) including Mg, Ca, and Ba, or a combination of 1+ and 3+ cations; $A_2$ is a 3+, 4+, or 5+ cation, including at least one of B, Al, Ga, C, Ge, P; $A_3$ is a 1−, 2−, or 3− anion, including F, Cl, and Br; and x is any value between 2.5 and 3.5, inclusive.

BACKGROUND

White LEDs are known in the art, and they are relatively recent innovations. It was not until LEDs emitting in the blue/ultraviolet region of the electromagnetic spectrum were developed that it became possible to fabricate a white light illumination source based on an LED. Economically, white LEDs have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LEDs are expected to meet industry standards for operation lifetimes of 100,000 hours, and efficiencies of 80 to 90 percent. High brightness LEDs have already made a substantial impact on such areas of society as traffic light signals, replacing incandescent bulbs, and so it is not surprising that they will soon provide generalized lighting requirements in homes and businesses, as well as other everyday applications.

There are several general approaches to making a white light illumination system based on light emitting phosphors. To date, most white LED commercial products are based on the approach shown in FIG. 1A, where light from a radiation source contributes directly to the color output of the white light illumination (in addition to providing excitation energy to a phosphor). Referring to the system 10 of FIG. 1A, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material capable of emitting light 14 after absorbing energy from the radiation source 11. The light 14 can be a substantially monochromatic color in the yellow region of the spectrum, or it can be a combination of green and red, green and yellow, or yellow and red, etc. Radiation source 11 also emits blue light in the visible that is not absorbed by the phosphor 13; this is the visible blue light 15 shown in FIG. 1A. The visible blue light 15 mixes with the yellow light 14 to provide the desired white illumination 16 shown in the figure.

Alternatively, a newer approach has been to use non-visible radiation sources that emit light in the ultra-violet (UV). This concept is illustrated generally at reference numeral 20 in FIG. 1B, which illustrates an illumination system comprising a radiation source that emits in the non-visible such that the light coming from the radiation source does not contribute substantially to the light produced by the illumination system. Referring to FIG. 1B, substantially non-visible light is emitted from radiation source 21 as light 22, 23. Light 22 has the same characteristics as light 23, but the two different reference numerals have been used to illustrate the following point: light 22 may be used to excite a phosphor, such as phosphor 24 or 25, generating photoemitted light 26 and 27, respectively, but the light 23 emitted from the radiation source 21 which does not impinge on a phosphor does not contribute to the color output 28 from the phosphor(s) because light 23 is substantially invisible to the human eye.

What is needed is an improvement over the orange phosphors of the prior art where the improvement is manifested at least in part by an equal or greater conversion efficiency from the radiation source 11 to orange light. The enhanced orange phosphors of the present embodiments have higher efficiency than prior art orange phosphors. The present orange phosphors may be used in conjunction with either a UV, blue, green, or yellow LED as the radiation source 11 to generate orange and/or red light whose color output is stable, and whose color mixing results in the desired uniform color temperature and the desired color rendering index.

SUMMARY OF THE INVENTION

Embodiments of the present invention are directed in general to the fluorescence of $Eu^{2+}$-activated silicates configured to emit in the orange region of the spectrum for use in colored LEDs, and white light illumination systems (e.g., white light emitting diodes). In particular, the orange phosphors of the present invention comprise silicate-based compounds having the formula $(Sr,A_1)_x(Si,A_2)(O,A_3)_{2+x}:Eu^{2+}$, where $A_1$ is at least one divalent cation (a 2+ ion) including Mg, Ca, Ba, or Zn, or a combination of 1+ and 3+ cations; $A_2$ is a 3+, 4+, or 5+ cation, including at least one of B, Al, Ga, C, Ge, P; $A_3$ is a 1−, 2−, or 3− anion, including F, Cl, and Br; and x is any value between 2.5 and 3.5, inclusive. The formula is written to indicate that the $A_1$ cation replaces Sr; the $A_2$ cation replaces Si, and the $A_3$ anion replaces O. In the case where $A_1$ is a combination of substantially equal numbers of 1+ and 3+ cations, this overall charge is averaged such that it is substantially equal to that achieved by the same number of 2+ cations.

In particular, the orange phosphors of the present invention comprise a silicate-based compound having at least one divalent alkaline earth element M that is Mg, Ca, Ba, or Zn in a relationship generally represented by the formula $(Sr_{1-x}M_x)_3SiO_5:Eu^{2+}$. In alternative embodiments, the orange phosphors of the present invention have the formula $(Sr_{1-x}M_x)_yEu_zSiO_5$, where M is at least one of a divalent metal selected from the group consisting of Ba, Mg, Ca, and Zn; $0<x<0.5$; $2.6<y<3.3$; and $0.001<z<0.5$. These phosphors are configured to emit visible light having a peak emission wavelength greater than about 565 nm.

In alternative embodiments, the orange phosphors of the present invention have the formula $(M_{1-x}Eu_x)_ySiO_5:(F,Cl,Br)$, where M is at least one of a divalent metal selected from the group consisting of Sr, Ca, Ba, Zn, and Mg; $0.01<x<0.1$; and $2.6<y<3.3$. These halogen containing orange phosphors may alternatively be described as $(M_{1-x}Eu_x)_ySiO_5(F,Cl,Br)_{6z}$, with M being the same as above, the values of x and y being the same as above, and where the parameter z that describes the amount of the halogen in the composition defined by $0<z<0.1$.

In further embodiments of the present invention, the present orange phosphors may be used in a white LED. Such a white light illumination system comprises a radiation source configured to emit radiation having a wavelength greater than about 280 nm; and a silicate-based orange phosphor configured to absorb at least a portion of the radiation from the radiation source and emit light with a peak intensity in a wavelength greater than about 565 nm. The orange phosphor has the formula $(Sr,A_1)_x(Si,A_2)(O,A_3)_{2+x}:Eu^{2+}$, where $A_1, A_2, A_3$, and the values of x are defined as above.

Methods of producing the present orange phosphors include sol-gel methods, solid reaction methods, and co-precipitation methods. An exemplary co-precipitation method includes the steps of:

a) dissolving $Sr(NO_3)_3$ in water;

b) dissolving $Eu_2O_3$ in nitric acid;

c) dissolving $SrF_2$ in nitric acid;

d) mixing the resulting solutions of steps a), b), and c);

e) adding $(CH_3O)_4Si$ to the resulting solution of step d), and then adding an acid to the mixture to cause precipitation;

f) adjusting the pH of the mixture of step e) to about 9;

g) drying the reaction product of step f) and then calcining the reaction product to decompose the precipitant; and h) sintering the precipitant of step g) in a reducing atmosphere.

Excitation spectra shows that the present orange phosphors are efficient at fluorescing when excited at wavelengths ranging from about 480 to 560 nm. The present orange phosphors offer emission characteristics that have advantages over the phosphors of the prior art, including both the spectral position of the emission peak, as well as the maximum intensity of the peak. For example, the phosphor demonstrating the greatest emission intensity in the experiments of this disclosure was phosphor $(Sr_{0.97}Eu_{0.03})_3SiO_5:F$. This phosphor demonstrates not only the highest intensity emission of five phosphors studied, but also the second longest peak emission wavelength (about 590 nm). The phosphor showing the longest wavelength emission in these studies was $(Ba_{0.075}Mg_{0.025}Sr_{0.9})_3SiO_5:Eu^{2+}F$ (about 600 to 610 nm).

The effect of varying the ratio of the alkaline earth metal to the silicon in the host lattice, the type of alkaline earth metal, the effect of the content of the Eu activator, and the role of the halogen dopant are discussed in the disclosure.

BRIEF DESCRIPTION OF THE DRAWINGS

FIG. 6A shows the actual data, and FIG. 6B shows the data wherein two of the intensities of two of the curves have been normalized to the height of the third in order to more easily compare the positions of the peak maximums in terms of wavelength;

FIG. 13 is a table of exemplary phosphors combined in various ways, and excited by a visible blue LED (hence, corresponding to the configuration in FIG. 1A), the table giving optical results, as well as identifying the samples whose emission spectra are shown in FIGS. 14 and 15;

DETAILED DESCRIPTION OF THE INVENTION

Figure 1A:
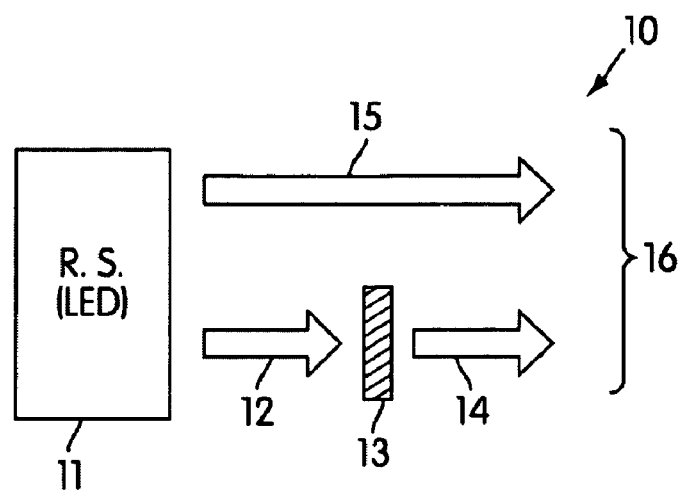
FIG. 1A is a schematic representation of a general scheme for constructing a white light illumination system, the system comprising a radiation source that emits in the visible, and a phosphor that emits in response to the excitation from the radiation source, wherein the light produced from the system is a mixture of the light from the phosphor and the light from the radiation source.

The novel orange silicate-based phosphors of the present invention have applications not only as long wavelength emitting constituent phosphors in white light illumination systems, but also in any application where an orange or other colored LED may be utilized. Orange LEDs may be excited by both UV and blue light sources because of the longer wavelength of the emitted orange color. Various embodiments of the present orange phosphors will be described in the following order: first, a general description of the novel silicate-based orange phosphor will be given, followed by a discussion of the nature of the host silicate lattice, the effect of varying the relative amounts of the alkaline earth metal to the silicon, and the effect of varying the relative amounts of different alkaline earth metals. Next, the effect of varying the activator content will be disclosed, followed by a discussion of the effect of anion inclusion such as a halogen. Phosphor processing and fabrication methods will be given. Finally, exemplary white light illumination systems that may include the novel orange phosphors of the present invention will be disclosed.

The Novel Orange Phosphors of the Present Embodiments

Embodiments of the present invention are directed in general to the fluorescence of $Eu^{2+}$-activated silicates configured to emit in the orange region of the spectrum for use in colored LEDs, and white light illumination systems (e.g., white light emitting diodes). In particular, the orange phosphors of the present invention comprise silicate-based compounds having the formula $(Sr,A_1)_x(Si,A_2)(O,A_3)_{2+x}:Eu^{2+}$, where $A_1$ is at least one divalent cation (a 2+ ion) including magnesium (Mg), calcium (Ca), barium (Ba), or zinc (Zn), or a combination of 1+ and 3+ cations; $A_2$ is a 3+, 4+, or 5+ cation, including at least one of boron (B), aluminum (Al), gallium (Ga), caron (C), germanium (Ge), and phosphorus (P); $A_3$ is a 1−, 2−, or 3− anion, including fluorine (F), chlorine (Cl), and bromine (Br); and x is any value between 2.5 and 3.5, inclusive. The formula is written to indicate that the $A_1$ cation replaces strontium (Sr); the $A_2$ cation replaces silicon (Si), and the $A_3$ anion replaces oxygen (O). In each of the examples described in this specification there is no element substiting for Si, and so the amount of $A_2$ may be 0.

The novel orange phosphors of the present invention may be described in general by the formula $(Sr_{1-x}M_x)_yEu_zSiO_5$, wherein M is at least one of a divalent metal selected from the group consisting of Ba, Mg, and Ca, but it may include other divalent elements as well, such as Zn. The values of x, y, and z follow the following relationships: $0<x<0.5$; $2.6<y<3.3$; and $0.001<z<0.5$. The phosphor is configured to emit visible light having a peak emission wavelength greater than about 565 nm. In some embodiments of the present invention, the phosphor has the formula $Sr_3Eu_zSiO_5$. In alternative embodiments the phosphor could be $(Ba_{0.05}Mg_{0.05}Sr_{0.9})_{2.7}Eu_zSiO_5$, $(Ba_{0.075}Mg_{0.025}Sr_{0.9})_3Eu_zSiO_5$, or $(Ba_{0.05}Mg_{0.05}Sr_{0.9})_3Eu_zSiO_5$.

In alternative embodiments of the present invention, the phosphor has the formula $(Mg_xSr_{1-x})_yEu_zSiO_5$, $(Ca_xSr_{1-x})_yEu_zSiO_5$, $(Ba_xSr_{1-x})_yEu_zSiO_5$, wherein the values of x and y follow the rules $0<x<1.0$ and $2.6<y<3.3$; and wherein the relationship between y and z is such that y+z is about equal to 3.

Figure 2:
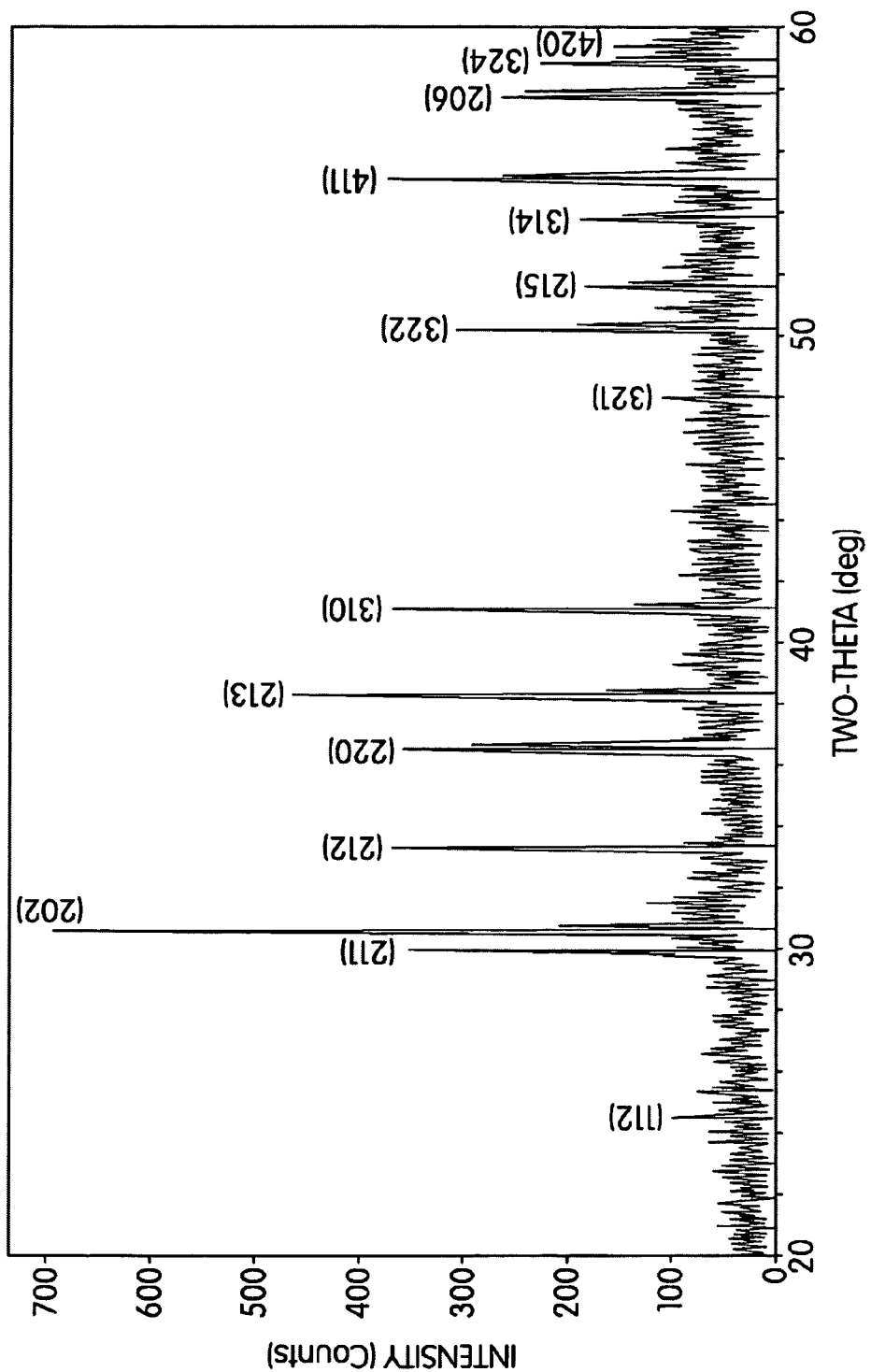
FIG. 2 is an x-ray diffraction pattern of an exemplary orange phosphor (having the formula $(Sr_{0.97}Eu_{0.03})_3SiO_5F_{0.18}$ (prepared by co-precipitation and sintering at 1250° C. in $H_2$ for 6 hours) to illustrate the crystalline nature of the silicate host lattice.

As taught by G. Blasse et al. in Philips Research Reports Vol. 23, No. 1, pp. 1-120, the host lattice in a phosphor belonging to the system $Me_3SiO_5$, where Me is either Ca, Sr, or Ba, has the crystal structure (or is related to the crystal structure) $Cs_3CoCl_5$. That the host lattice of the phosphors of the present invention is also crystalline is demonstrated by the x-ray diffraction pattern shown in FIG. 2. The exemplary phosphor in FIG. 2 is $(Sr_{0.97}Eu_{0.03})_3SiO_5F_{0.18}$, which was prepared by co-precipitation and sintering at 1250° C. in $H_2$ for 6 hours).

Figure 3:
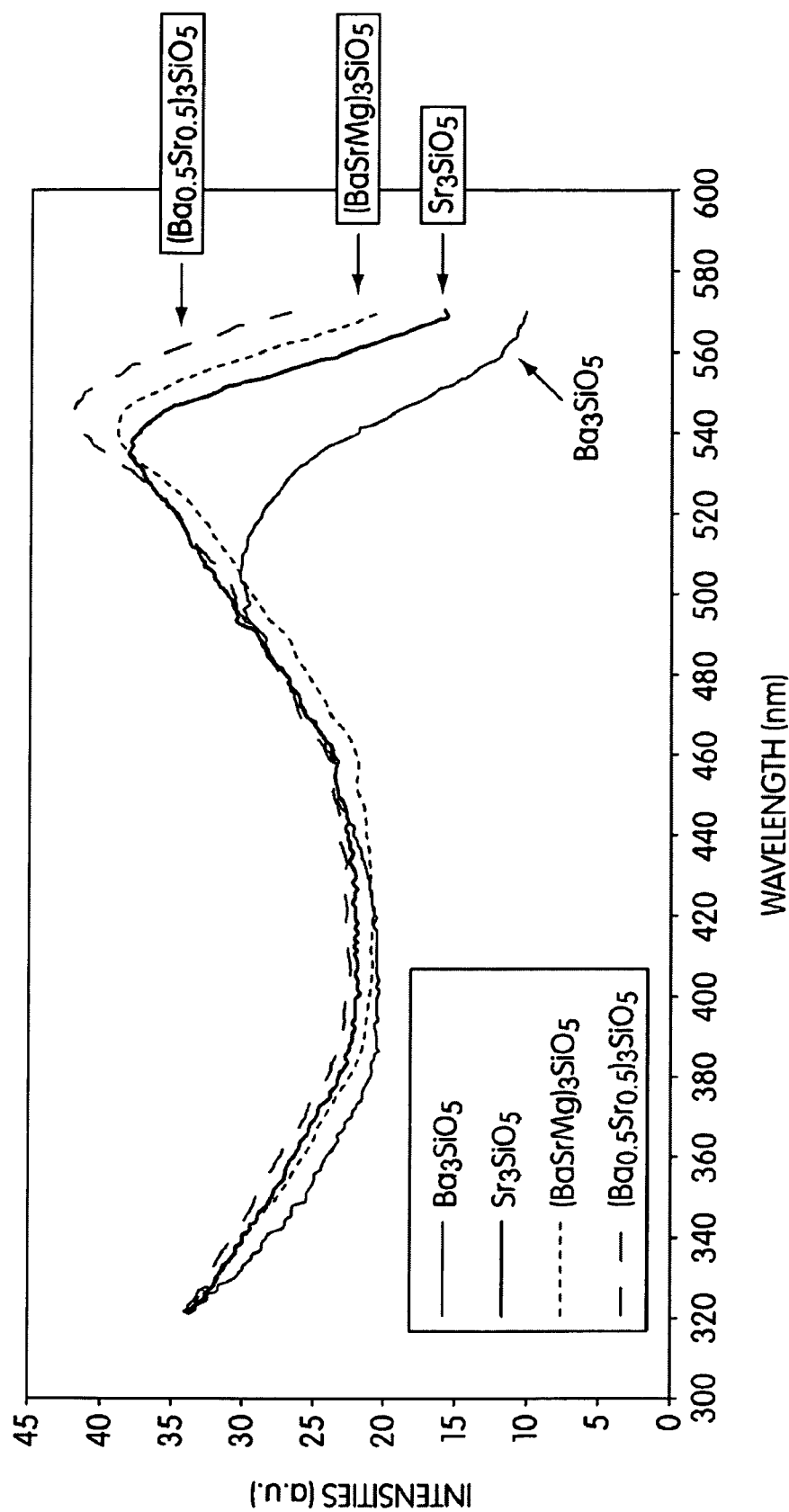
FIG. 3 shows the excitation spectra of $Ba_3SiO_5$, $Sr_3SiO_5$, $(Ba_{0.5}Sr_{0.5})_3SiO_5$, and $(BaSrMg)SiO_5$ (the emission intensity of the phosphors having been recorded at a wavelength of 590 nm), the spectra showing that these phosphors are efficient at fluorescing when excited at wavelengths ranging from about 280 to 560 nm.

Excitation spectra are prepared by observing changes in the emitted light intensity at a set wavelength while varying the excitation energy (see, for example, the Phosphor Handbook, edited by S. Shionoya and W. M. Yen, CRC Press, New York, 1999, p. 684). The excitation spectrum of exemplary orange phosphors of the present invention are shown in FIG. 3, where the exemplary phosphors are $Ba_3SiO_5$, $Sr_3SiO_5$, $(Ba_{0.5}Sr_{0.5})_3SiO_5$, and $(BaSrMg)SiO_5$. The emission intensity of the phosphors was recorded at a wavelength of 590 nm.

The excitation spectra in FIG. 3 shows that these phosphors are efficient at fluorescing when excited at wavelengths ranging from about 480 to 560 nm. The intensity of the light emitted at 590 nm is greatest for the phosphor $(Ba_{0.5}Sr_{0.5})_3SiO_5$, and this occurs when the wavelength of the excitation radiation is about 545 to about 550 nm. The phosphor demonstrating the second greatest emission intensity in FIG. 3 is $(Ba,Sr,Mg)_3SiO_5$, which occurs when the wavelength of the excitation radiation is a little greater than 540 nm (the commas between the Ba, Sr, and Mg in this formula indicate that the numerical relationship between these three elements is not being specified, as long as the ratio between the sum of these constituents to silicon is about 3:1). Virtually equally intense (albeit perhaps slightly less) in emission is the phosphor $Sr_3SiO_5$, where its maximum emission occurs for excitation radiation having a wavelength a little less than 540 nm. Of the four phosphors in this exemplary series, $Ba_3SiO_5$ demonstrated the lowest intensity emission; the peak of this emission occurs when the wavelength of the excitation radiation is about 510 nm.

Figure 4:
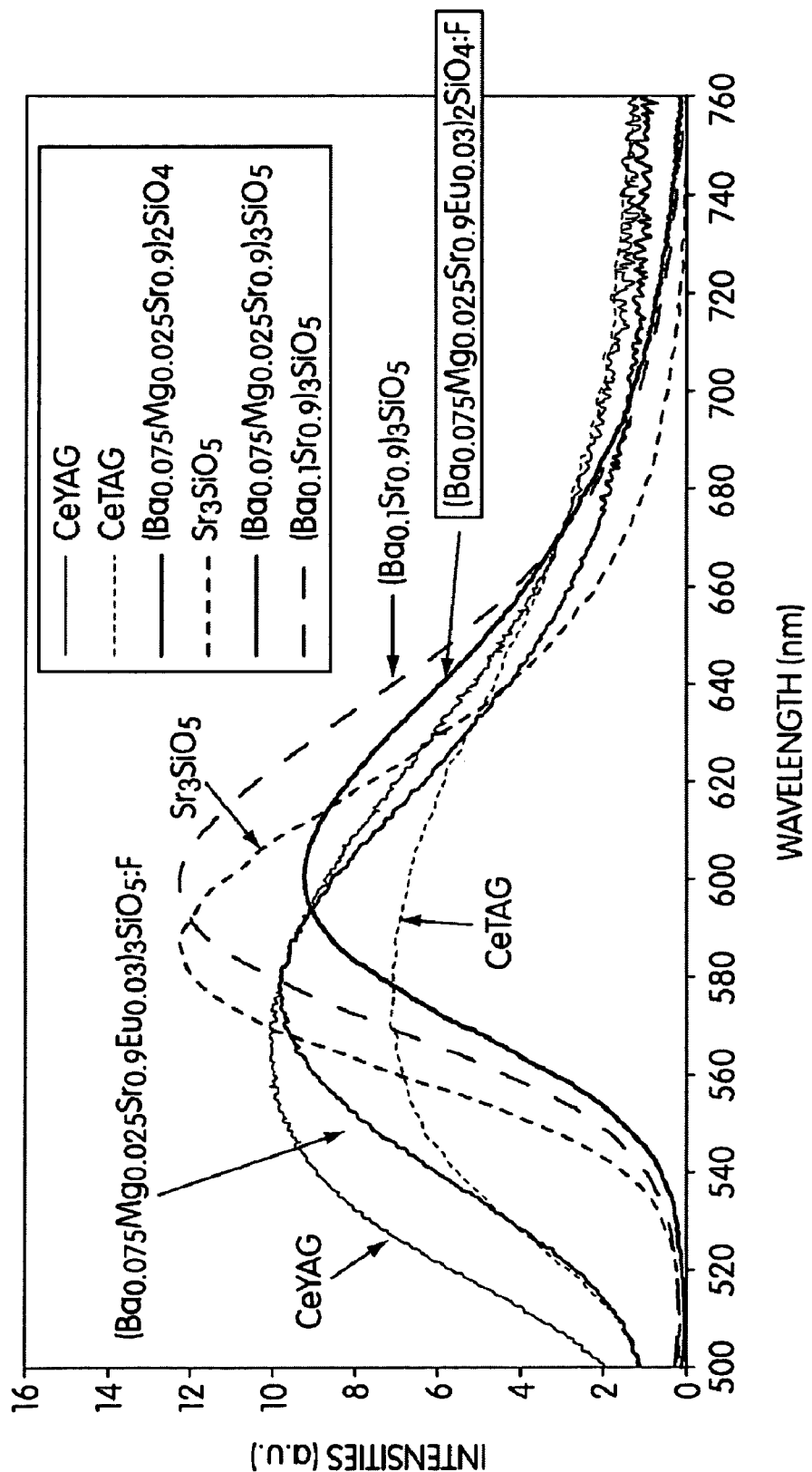
FIG. 4 shows a collection of emission spectra of prior art phosphors such as YAG:Ce and TAG:Ce relative to exemplary phosphors of the present invention having the formulas $Sr_3SiO_5$, $(Ba_{0.1}Sr_{0.9})_3SiO_5$, and $(Ba_{0.075}Mg_{0.025}Sr_{0.9})_3SiO_5:F$, respectively, showing that the exemplary phosphors have longer emission wavelengths than the prior art phosphors, and in some cases, higher emission intensities.

The present orange phosphors offer emission characteristics that have advantages over the phosphors of the prior art. These characteristics include both the spectral position of the emission peak maximum (the wavelength at which the maximum of the emission peak occurs), as well as its intensity. This is particularly true in regards to the contribution the novel orange phospohors make to the white light produced by a white LED illumination system. FIG. 4 shows a collection of emission spectra of the prior art phosphors YAG:Ce and TAG:Ce relative to exemplary phosphors of the present invention, the present phosphors having the formulas $Sr_3SiO_5$, $(Ba_{0.1}Sr_{0.9})_3SiO_5$, and $(Ba_{0.075}Mg_{0.025}Sr_{0.9})_3SiO_5$. Also included, for comparison, is a phosphor developed by the present inventors given by the formula $(Ba_{0.075}Mg_{0.025}Sr_{0.9})_2SiO_4$.

Referring to FIG. 4, the phosphors demonstrating the greatest emission intensity are the phosphors $(Ba_{0.1}Sr_{0.9})_3SiO_5$, and $(Sr_{0.97}Eu_{0.03})_3SiO_5$:F. These phosphors demonstrate not only the highest intensity emission of the five phosphors depicted in FIG. 4, but also the some of the longest peak emission wavelengths in the graph, ranging from about 585 to 600 nm, well within the orange region of the electromagnetic spectrum. Of the exemplary phosphors of the present invention, the phosphor showing the shortest wavelength emission in FIG. 4 is the phosphor represented by the formula $(Ba_{0.075}Mg_{0.025}Sr_{0.9}Eu_{0.03})_3SiO_5$:F, with a peak wavelength emission slightly less than 580 nm.

The $(Ba_{0.075}Mg_{0.025}Sr_{0.9}Eu_{0.03})_3SiO_5$:F phosphor has an emission intensity similar to two yellow phosphors also shown in FIG. 4 for comparison. The first of these yellow phosphors is the prior art phosphor YAG:Ce, with a peak emission wavelength at around 560 nm (well within the yellow region of the electromagnetic spectrum). The second yellow phosphor shown for comparison is a novel phosphor described in a patent application assigned to the inventors of the present application; this phosphor has the formula $(Ba_{0.075}Mg_{0.025}Sr_{0.9})_2SiO_4$:$Eu^{2+}$F, which is also in the yellow region but with a longer peak emission wavelength of about 575 nm, and longer than that of the YAG:Ce. The fifth phosphor whose emission spectrum was measured in FIG. 4 for comparison was a commercially available TAG:Ce; this phosphor has the lowest emission intensity of the five phosphors in the series. The TAG:Ce phosphor shows a peak emission wavelength of about 575 nm, more yellow and less orange color.

Further novel characteristics of the present orange phosphors may be appreciated by considering relationships among the various components of the present phosphors. For example, the ratio of the strontium (Sr), barium (Ba), magnesium (Mg), calcium (Ca), etc., to the silicon (Si) content in the formula $(Sr_{1-x}M_x)_yEu_zSiO_5$ may be characterized, as well as the effect of the different alkaline earth metal(s) "M" in the composition. A further way to characterize the present phosphors is to describe the effects of varying the concentration of the europium (Eu) activator in the phosphor.

Figure 5:
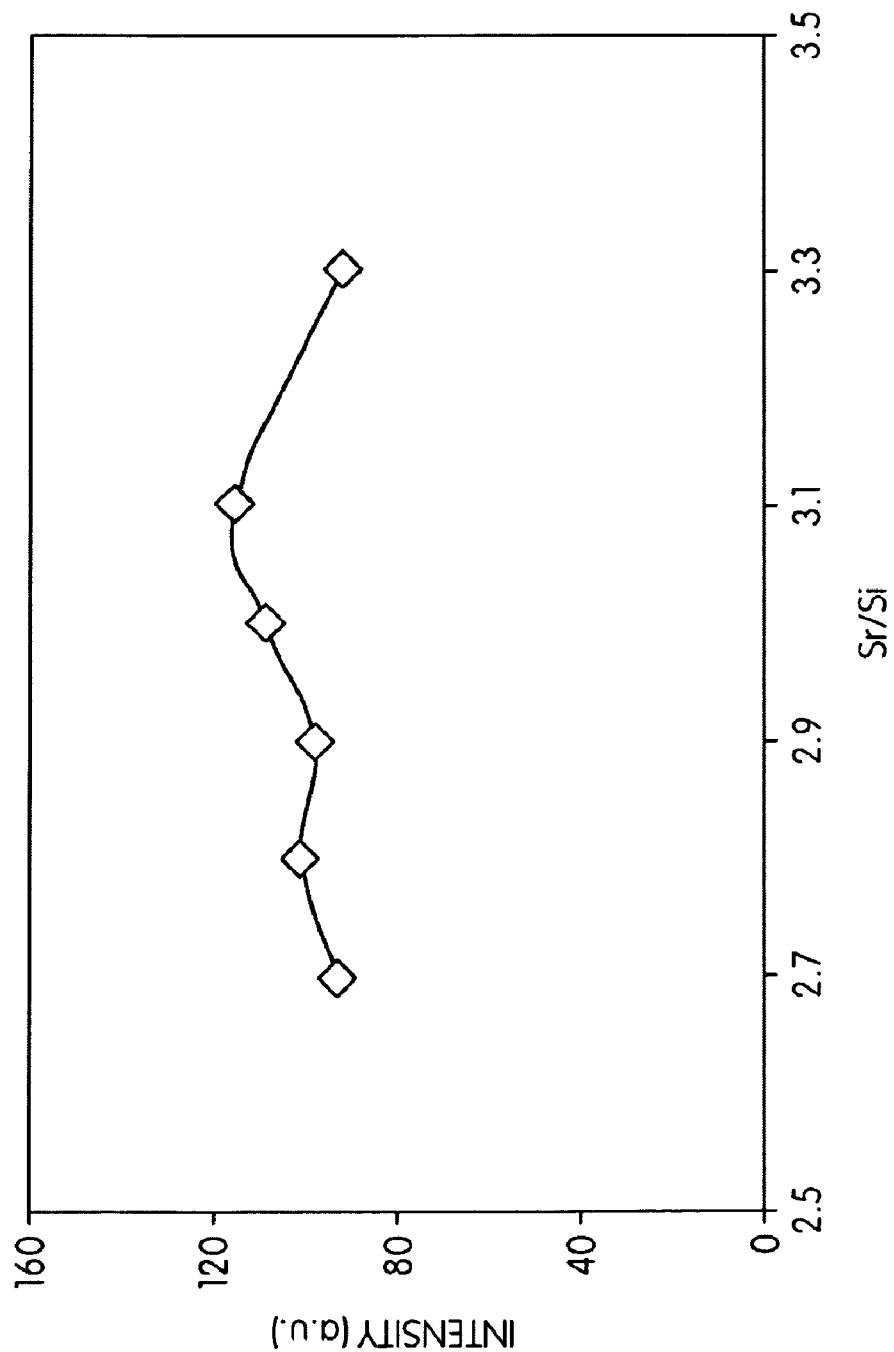
FIG. 5 is a graph of peak emission intensity as a function of the ratio of Sr to Si in the series $(Sr_{0.97}Eu_{0.03})_ySiO_5$, showing one example of the effect of the content of the alkaline earth in a host lattice of the type $M_3SiO_5:Eu^{2+}$, where M in this example is Sr.

The Effect of Varying the Ratio of the Alkaline Earth Metal to the Silicon in the Host Lattice An example of the effects of varying the ratio of the Sr (or Ba, Ca, etc.) to Si content in a series of exemplary phosphors having the formula $(Sr_{0.97}Eu_{0.03})_ySiO_5$ is shown in FIG. 5. The data shows that a maximum in the emission intensity is found when the ratio of Sr to Si is about 3.1 (in this series, having a fixed amount of the europium activator of 0.03, relative to the amount of the content of alkaline earth metal). A secondary maximum in intensity is found at about 2.8. The point of this graph is to show that it is not necessary to stick rigidly to the formulation $M_3SiO_5$, where M is the amount of Sr, Ba, Ca, Eu, etc., and where the ratio of the alkaline earth metal or other element M to the silicon is fixed at a value of about 3.0. In fact, there are advantages in varying this ratio relative to traditional values for the purposes of enhancing emission intensity.

The Effect of the Type of Alkaline Earth Metal

Varying the nature (meaning identity) and the content of the alkaline earth metal in the present orange phosphors has an effect on both the peak value of the emission intensity and the emission wavelength. As described above, the alkaline earth metal M may be selected from the group consisting of magnesium (Mg), strontium (Sr), calcium (Ca), and barium (Ba) in the series $(M_xSr_{1-x})_{2.91}Eu_{0.09}SiO_5$.

Figure 6A:
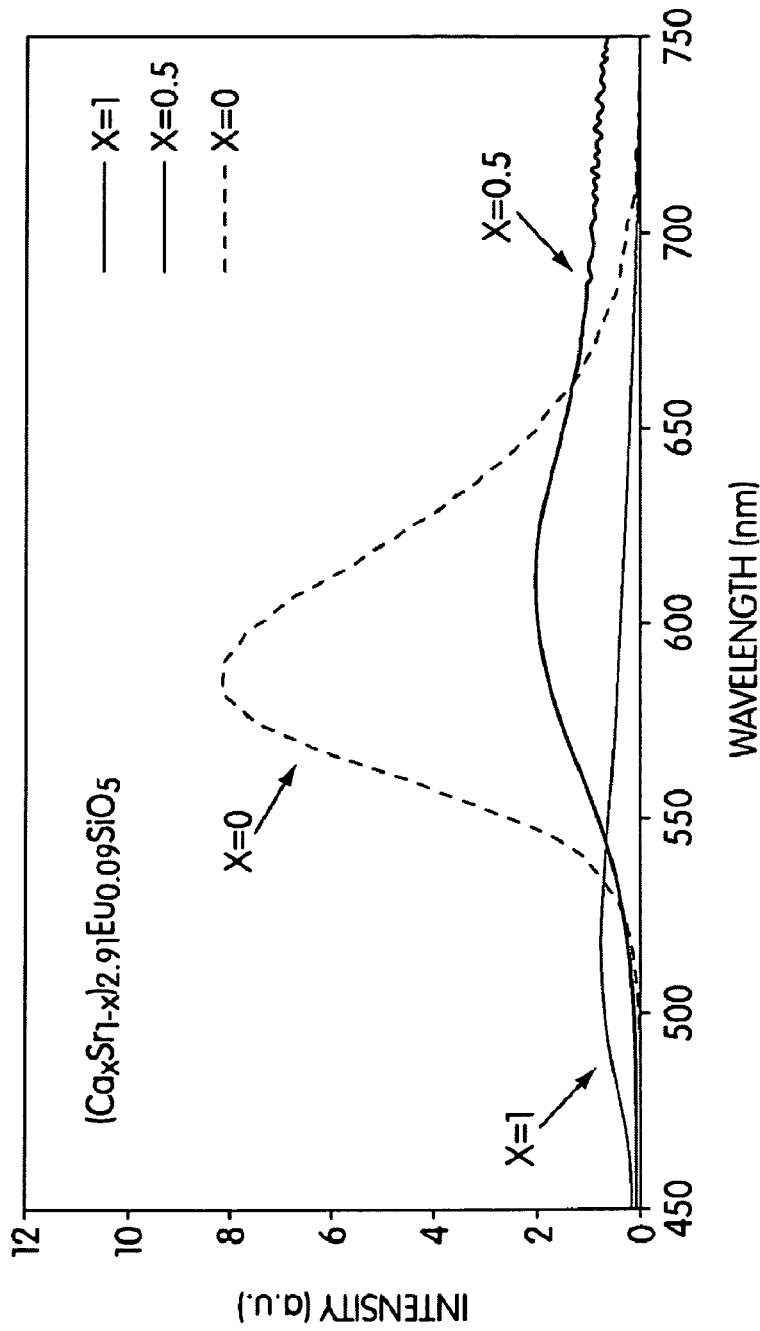
FIGS. 6A and 6B are collections of emission spectra for the series $(Ca_xSr_{1-x})_{2.91}Eu_{0.09}SiO_5$, showing the effect of varying the relative amounts of the two different alkaline earth metals M and N in a phosphor having the generalized formula $(M,N)_3SiO_5:Eu^{2+}$ on peak emission intensity and peak emission wavelength (in this case M being Ca and N being Sr)
Figure 6B:
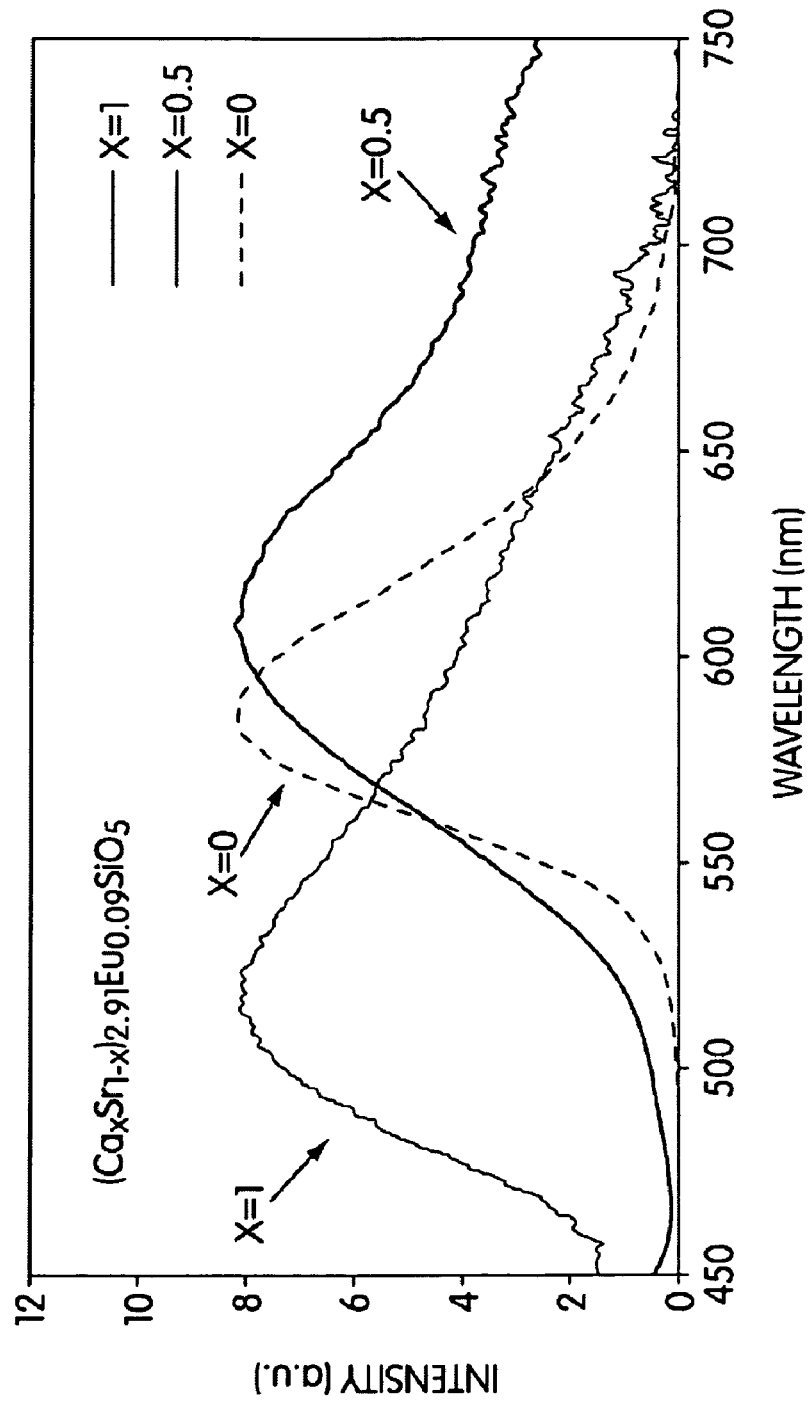

The effect of the inclusion of the two different alkaline earth metals Ca and Mg is shown in FIGS. 6A, 6B, and FIGS. 7A and 7B. FIG. 6A is the actual data of an emission spectra of a series of phosphors having the formula $(Ca_xSr_{1-x})_{2.91}Eu_{0.09}SiO_5$, where different phosphors having the values of x equal to 0.0, 0.5, and 1.0 were tested. Because the emission intensities were so different, and it can therefore be difficult to see where the peak wavelengths occur, the data of FIG. 6A was re-plotted by normalizing the x=1 and x=0.5 data such that all three peaks have essentially the same height as the peak for the x=0 composition. This re-plotted data is shown in FIG. 6B.

In this series, the composition with the intermediary ratio of Ca to Sr (in other words, the composition with substantially equal amounts of Ca and Sr) demonstrated the longest peak wavelength emission at about 605 to 610 nm. This is more toward the red, and away from yellow, than either of the other two members of the series. The composition comprising mostly calcium (x=1) showed the shortest peak emission wavelength at about 510 nm, which is a color towards the green end of yellow. The composition having all strontium and no calcium was in the middle of the distribution, with a peak wavelength emission at about 590 nm.

Figure 7A:
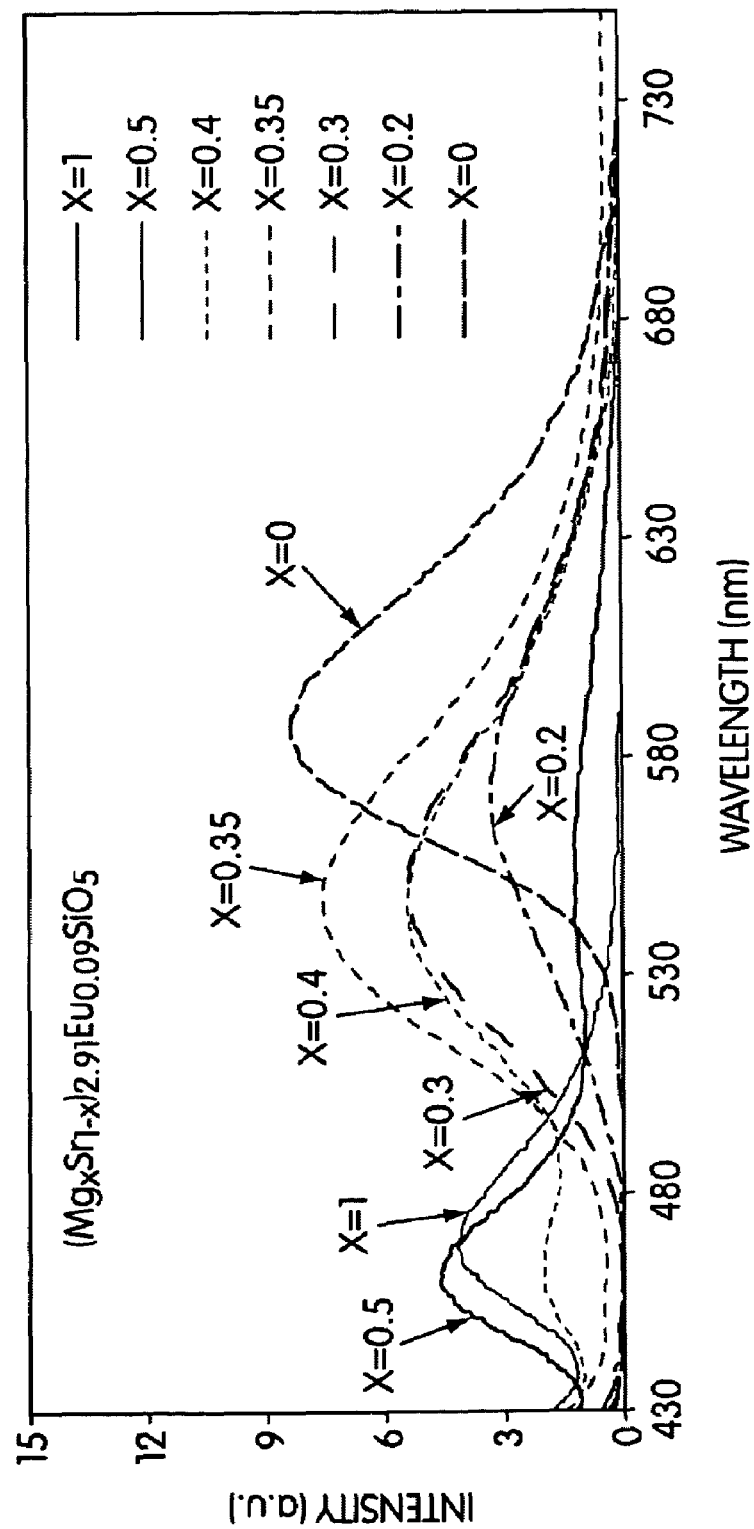
FIGS. 7A and 7B are a collection of emission spectra for the series $(Mg_xSr_{1-x})_{2.91}Eu_{0.09}SiO_5$ (the excitation wavelengths in FIGS. 7A and 7B being 403 nm and 450 nm, respectively), the figures showing the effect of varying the relative amounts of the two alkaline earth metals M and N in a phosphor having the generalized formula $(M,N)_3SiO_5:Eu^{2+}$ on peak emission intensity and peak emission wavelength (in this case M being Mg and N being Sr)
Figure 7B:
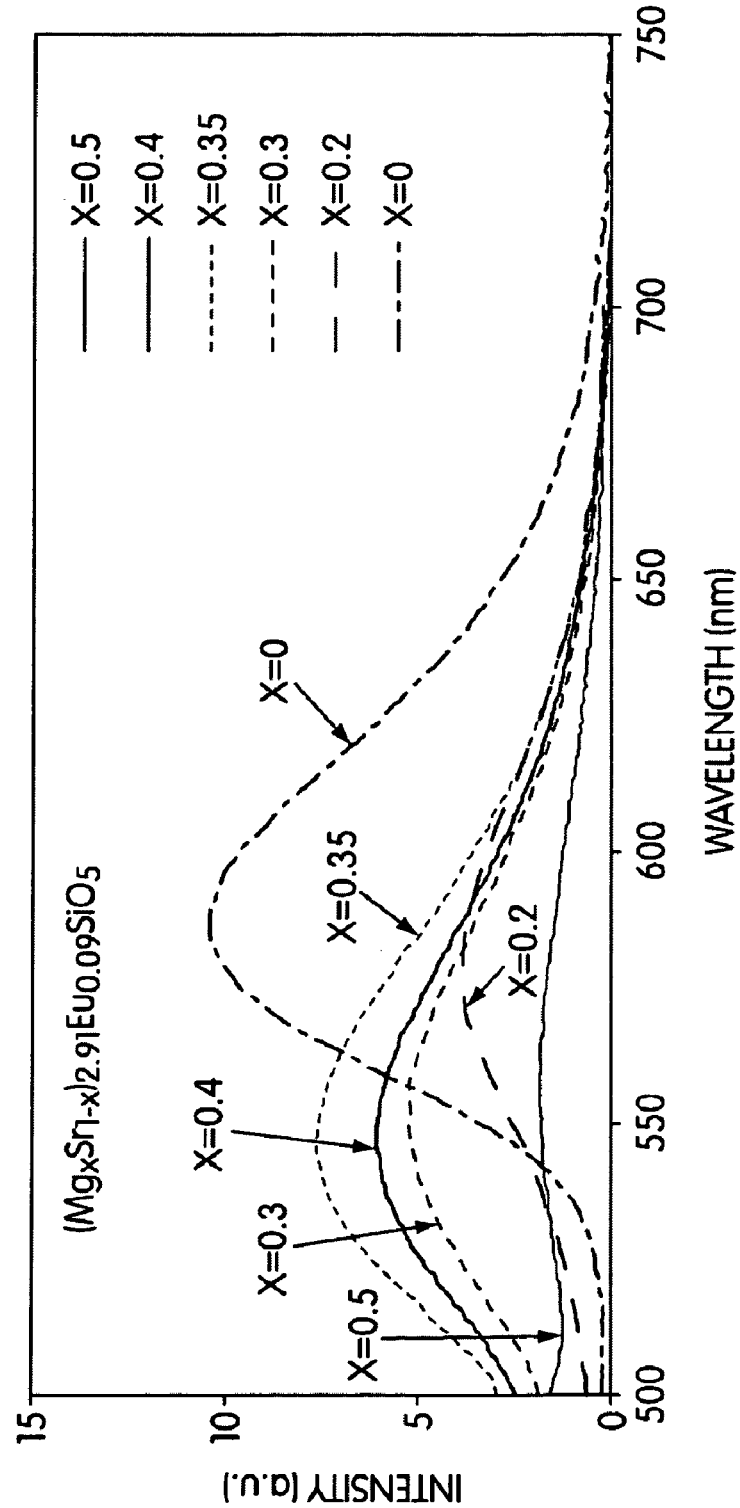

Referring to FIGS. 7A and 7B, it may be observed that substitution of magnesium for strontium in the composition $(Mg_xSr_{1-x})_{2.91}Eu_{0.09}SiO_5$ decreases the intensity of the emission, as well as shifting the wavelength of the peak emission to shorter wavelengths. This is the case for both situations where the phosphor has been excited at a 403 nm (FIG. 7A), and at 450 nm (FIG. 7B). The composition comprising entirely strontium as the alkaline earth metal component (x=0) emits at the longest wavelength for both excitation wavelengths, and again this emission occurs at about 590 nm. The substitution of a small amount of magnesium for strontium (x=0.2) reduces the intensity of the emission significantly, but without changing the wavelength of the emission substantially.

Referring to FIG. 7B, substitution of still further amounts of magnesium for strontium to initially a level of x=0.30, followed by further reduction to a level of x=0.35, increases the emission intensity from that of the x=0.2 composition, albeit not to a full recovery of the intensity which had been demonstrated for zero levels of magnesium. At this point in the series of magnesium substitution for strontium (the level x=3.5), the second highest emission intensity in the series is observed. From this concentration on, further substitution of magnesium for strontium (to values of x=0.4 and x=0.5, respectively) decreases the intensity, at first only to a small degree, and then rather substantially. The peak emission wavelength of the compositions x=0.3, 0.35 and 0.4 x=0.5 range from about 530 to 560 nm.

For the purposes of comparison (recognizing that the phosphors described in this paragraph do not specifically emit in the orange region of the spectrum) the emission intensity of a phosphor having the generalized formula $Mg_3SiO_5$ were compared to that of a conventional BAM. A conventional BAM was chosen for comparison because the phosphor $Mg_3SiO_5$ emits a blue color.

Figure 8:
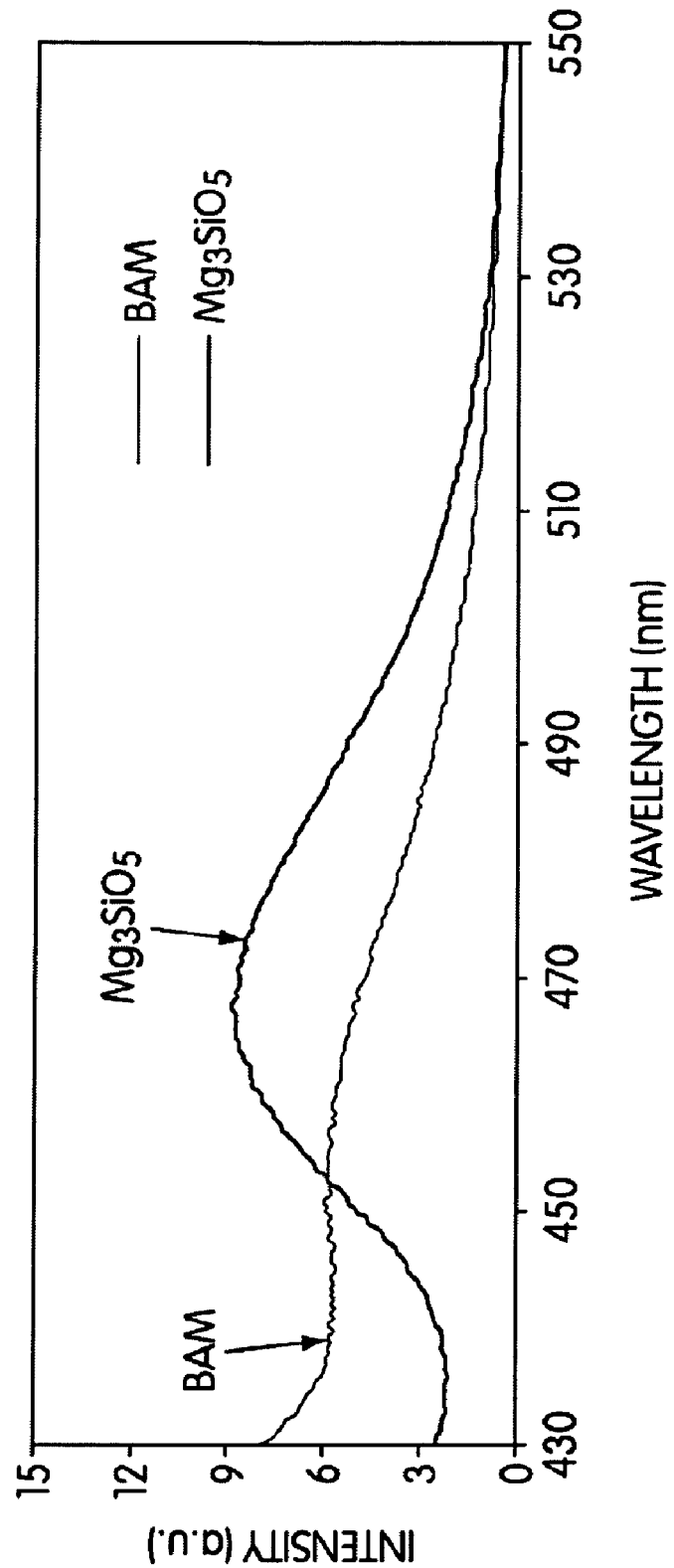
FIG. 8 is an emission spectra of a composition comprising the formula $Mg_3SiO_5$, shown for the purposes of illustrating the effect of having M be Mg in the family of $M_3SiO_5$ phosphors; because the $Mg_3SiO_5$ phosphor emits in the blue region of the spectrum its emission characteristics are compared to those of a conventional barium magnesium aluminate (BAM) phosphor.

The results of this comparison are shown in FIG. 8. FIG. 8 is an emission spectra of a composition comprising the formula $Mg_3SiO_5$, shown for the purposes of comparing an $M_3SiO_5$ phosphor wherein M is Mg in this case, plotted with a conventional BAM because the $Mg_3SiO_5$ phosphor emits in the blue. The $Mg_3SiO_5$ phosphor emits at a peak wavelength of about 470, with a much greater intensity of the convention BAM. It should be noted that the $Mg_3SiO_5$ compound is not a pure phase.

The Effect of the Content of the Eu Activator

Figure 9:
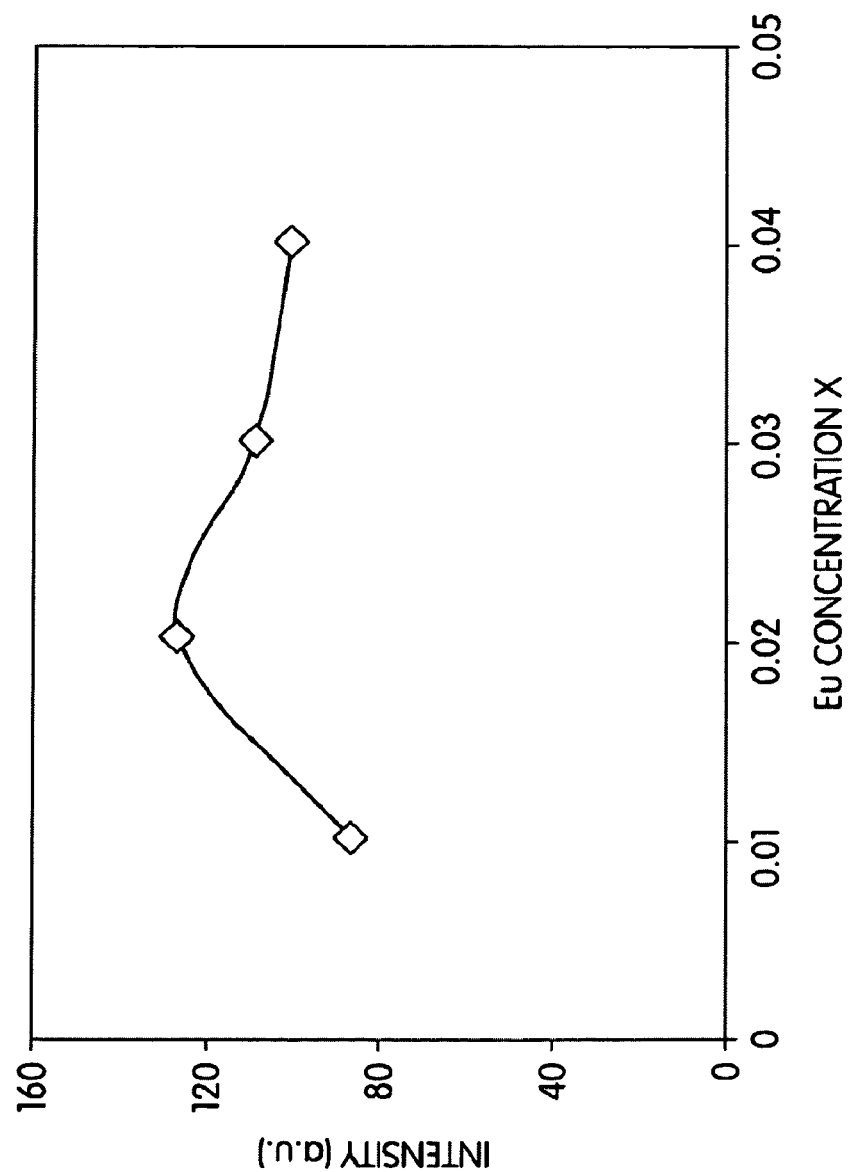
FIG. 9 is a graph of the peak emission intensity as a function of Eu doping concentration in a series of phosphors having the general formula $(Sr_{1-x}Eu_x)_3SiO_5$, the spectra showing that the highest emission intensity occurs at an activator concentration of about 2 atomic percent (relative to the alkaline-earth metals)

The optimum activator concentration in a composition $Me_3SiO_5$ has been reported to be a few atomic per cent of europium, relative to the alkaline earth metals Me (where Me is Ca, Sr, and Ba; see the article by G. Blasse et al. in Philips Research Reports, Vol. 23, No. 1, 1968), and similar results were found are reported in this disclosure. The effect of varying the content of the europium activator in the present orange phosphor compositions, represented by the formula $(Sr_{1-x}Eu_x)_3SiO_5$, is shown in FIG. 9. The maximum emission intensity was found for the composition having an Eu concentration of 0.02, with the next most intense composition being x=0.03.

The present silicate-based orange phosphor may be represented in general by the formula $(Sr_{1-x}M_x)_yEu_zSiO_5$, where the level of the europium activator is described by the "z" parameter. According to embodiments of the present invention, the values of z range from about 0.001<z<0.5.

The Role of the Halogen Anion Dopant

The effect of including a halogen into the present orange phosphors, such embodiments having the formula $(M_{1-x}Eu_x)_ySiO_5(F,Cl,Br)_{6z}$, will now be discussed. In this embodiment, the amount that the halogen is included into the composition is described by the parameter "z." In one embodiment of the present invention, z ranges from 0<z<0.1. Thus, the molar concentration of the halogen may range from greater than 0 to less than or equal to 0.6.

Figure 10:
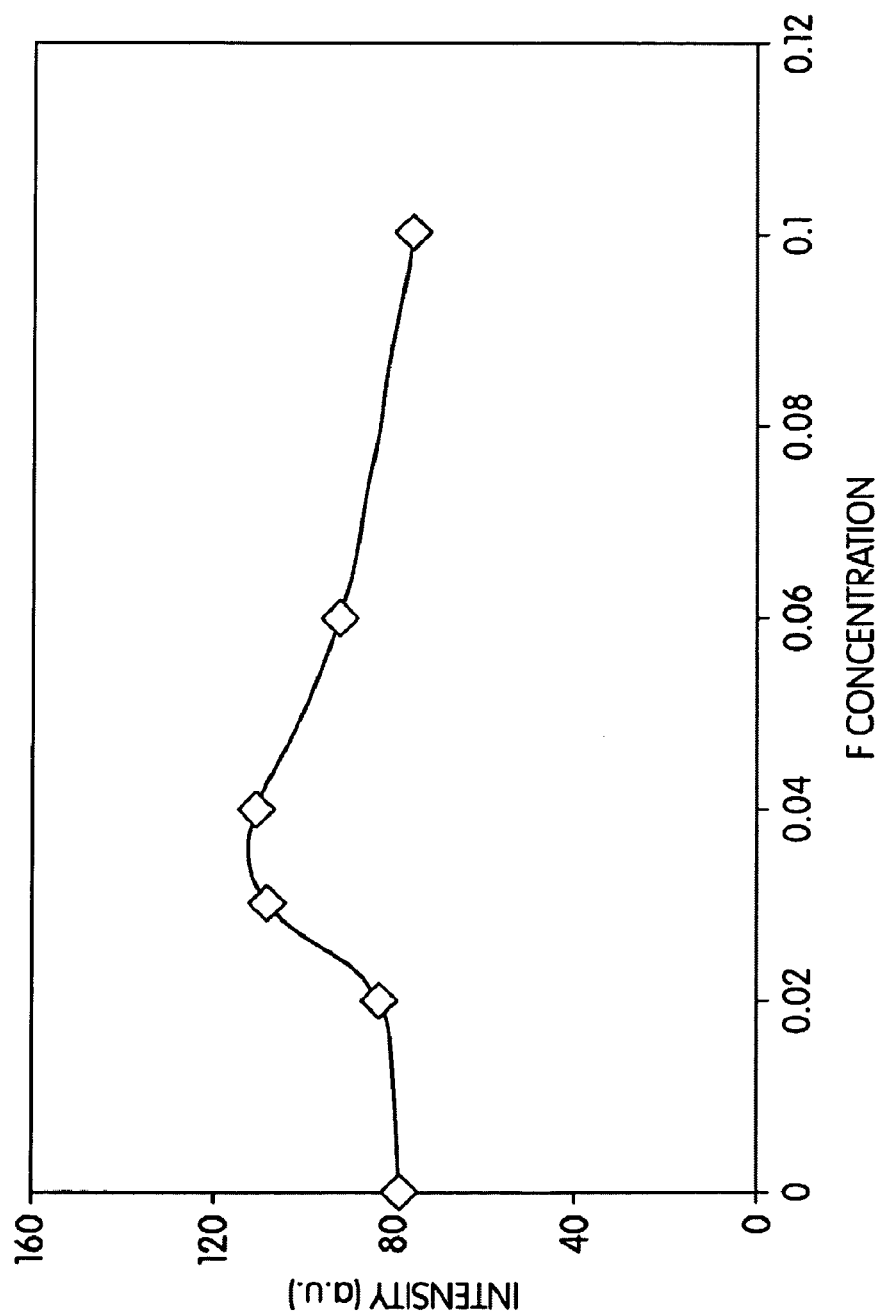
FIG. 10 is an emission spectrum of an exemplary phosphor of the present invention in the series $(Sr_{0.97}Eu_{0.03})_3SiO_5F_{6z}$, showing that the maximum peak emission intensity may be enhanced by including a halogen, in this case at a concentration of about 2 to 6 percent.
Figure 11:
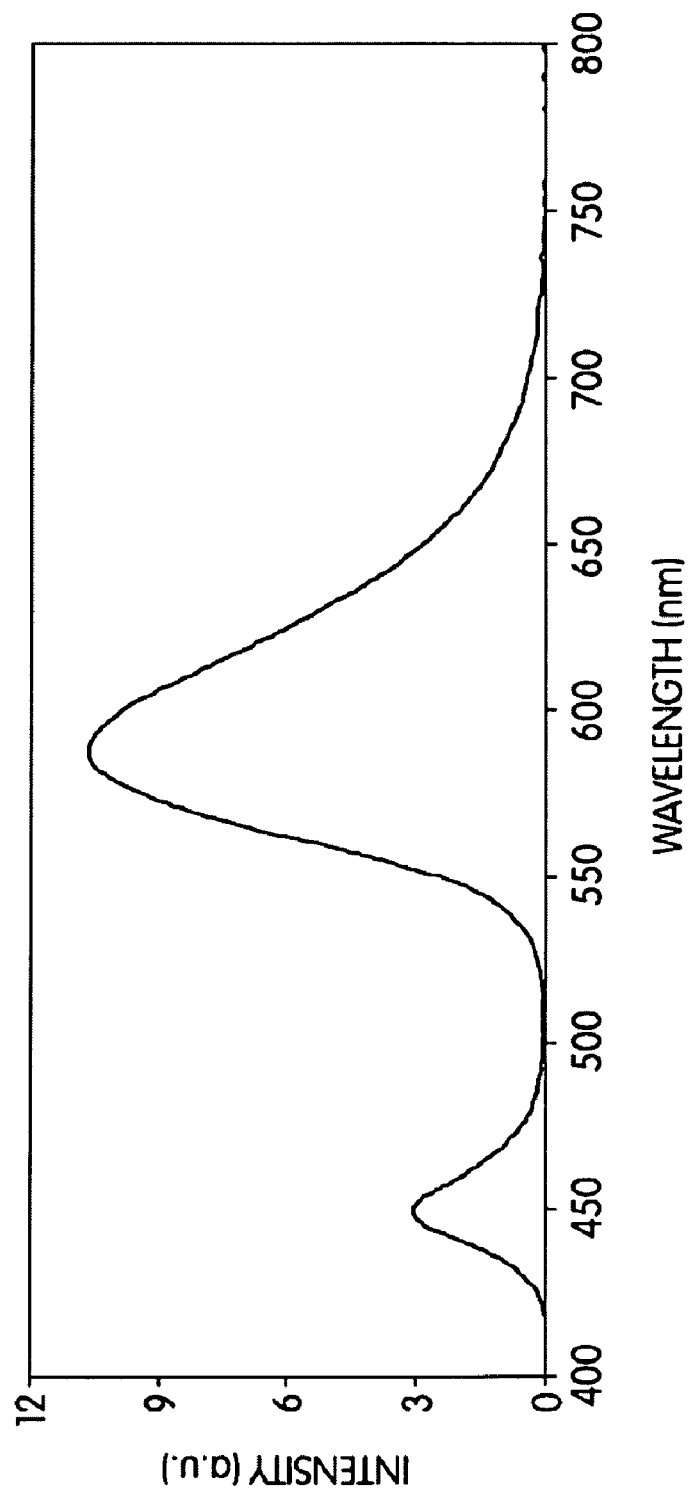
FIG. 11 is an emission spectra of an exemplary phosphor of the present invention containing a halogen dopant (in this case fluorine), the particular phosphor having the formula $(Sr_{0.97}Eu_{0.03})_3SiO_5F_{0.18}$.

The results of some specific tests are shown in FIGS. 10 and 11. FIG. 10 shows a graph of the intensity of the emission of the phosphor $(Sr_{0.97}Eu_{0.03})_3SiO_5F_{6z}$, where the fluorine (F) concentration. Inclusion of a halogen dopant into a phosphor for use in white light illumination systems is believed by the present inventors to be unique to the industry. Here, it is shown that an F concentration ranging from about 0.3 to 0.5 offers a substantial enhancement in emission intensity.

The emission spectrum of the compound $(Sr_{0.97}Eu_{0.03})_3SiO_5F_{0.18}$ is shown in FIG. 11. The phosphor in this experiment has been excited by radiation having a wavelength of about 450 nm, the excitation radiation included in the graph as shown by the small peak to the left. Consistent with previous data, this phosphor emits at about 590 nm (the larger peak to the right).

In one embodiment, fluorine is added to the phosphor composition in the form of a $NH_4F$ dopant. The present inventors have found that when the $NH_4F$ dopant amount is very small (about 1%), the position of the peak emission is located at shorter wavelengths, and as more $NH_4F$ is added, the wavelength increases with dopant amount. The luminescence of the Eu doped phosphor is due to the presence of the $Eu^{2+}$ in the compound, which undergoes an electronic transition from $4f^65d^1$ to $4f^7$. The wavelength positions of the emission bands depend very much on the host's material or crystal structure, changing from the near-UV to the red region of the spectrum. This dependence is interpreted as due to the crystal field splitting of the 5d level. With increasing crystal field strength, the emission bands shift to longer wavelength. The luminescence peak energy of the 5d-4f transition is affected most by crystal parameters denoting electron-electron repulsion; in other word, the distance between $Eu^{2+}$ cation and surrounding anions, and the average distance to distant cations and anions.

In the presence of small amounts of $NH_4F$, the fluorine anion dopant functions predominantly as a flux during sintering processing. Generally, a flux improves sintering processing in one of two ways: the first is to promote crystal growth with the liquid sintering mechanism, and the second is to absorb and collect the impurities from the crystal grains and improve the phase purity of the sintered materials. In one embodiment of the present invention, the host phosphor is $(Sr_{1-x}Ba_x)_3SiO_5$. Both Sr and Ba are very large cations. There may be present smaller cations such as Mg and Ca, which may be considered to be impurities. Therefore, further purification of host lattice will lead to more perfect symmetric crystal lattice and a larger distance between cations and anions, with a result of a weakening of the crystal field strength. This is the reason that small amount doping of $NH_4F$ moves the emission peak to shorter wavelength. The emission intensity increases with this small amount of F doping attributes to a higher quality crystal with fewer defects.

When the amounts of $NH_4F$ are increased even further, some of the $F^-$ anions will replace $O^{2-}$ anions, and become incorporated into the lattice. Cation vacancies will be created in order to maintain an electrical charge neutrality. Since the vacancies in the cation positions reduce the average distance between cations and anions, the crystal field strength will be increased. Therefore, the peak of the emission curves will move to longer wavelength as the $NH_4F$ content increases due to the increased number of cation vacancies. The emission wavelength is directly related to the energy gap between ground and excitation states which is determined only by the crystal field strength. The result of emission wavelength increases with the fluorine and chlorine is strong evidence of fluorine or chlorine incorporating into the host lattice, most likely in substitute of oxygen sites. On the other hand, the addition of a phosphate ion does not substantially change the emission wavelength, as expected. This is again evidence that phosphate acts as a cation, will not replace oxygen, and thus will not be easily incorporated into the lattice to change the host material's crystal field strength. This is particularly true of the crystal field surrounding the $Eu^{2+}$ ions, which consist essentially of oxygen sites. The improvement in the emission intensity gained by adding $NH_4H_2PO_4$ indicates that it works a flux agent as discussed above.

Phosphor Fabrication Processes

Methods of fabricating the novel silicate-based phosphors of the present embodiments are not limited to any one fabrication method, but may, for example, be fabricated in a three step process that includes: 1) blending starting materials, 2) firing the starting material mix, and 3) various processes to be performed on the fired material, including pulverizing and drying. The starting materials may comprise various kinds of powders, such as alkaline earth metal compounds, silicon compounds, and europium compounds. Examples of the alkaline earth metal compounds include alkaline earth metal carbonates, nitrates, hydroxides, oxides, oxalates, and halides. Examples of silicon compounds include oxides such as silicon oxide and silicon dioxide. Examples of europium compounds include europium oxide, europium fluoride, and europium chloride. As a germanium material for the germanium-containing novel yellow-green phosphors of the present invention, a germanium compound such as germanium oxide may be used.

The starting materials are blended in a manner such that the desired final composition is achieved. In one embodiment, for example, the alkaline-earth, silicon (and/or germanium), and europium compounds are bended in the appropriate ratios, and then fired to achieve the desired composition. The blended starting materials are fired in a second step, and to enhance the reactivity of the blended materials (at any or various stages of the firing), a flux may be used. The flux may comprise various kinds of halides and boron compounds, examples of which include strontium fluoride, barium fluoride, calcium fluoride, europium fluoride, ammonium fluoride, lithium fluoride, sodium fluoride, potassium fluoride, strontium chloride, barium chloride, calcium chloride, europium chloride, ammonium chloride, lithium chloride, sodium chloride, potassium chloride, and combinations thereof. Examples of boron-containing flux compounds include boric acid, boric oxide, strontium borate, barium borate, and calcium borate.

In some embodiments, the flux compound is used in amounts where the number of mole percent ranges from between about 0.1 to 3.0, where values may typically range from about 0.1 to 1.0 mole percent, both inclusive.

Various techniques for mixing the starting materials (with or without the flux) include using a mortar, mixing with a ball mill, mixing using a V-shaped mixer, mixing using a cross rotary mixer, mixing using a jet mill and mixing using an agitator. The starting materials may be either dry mixed or wet mixed, where dry mixing refers to mixing without using a solvent. Solvents that may be used in a wet mixing process include water or an organic solvent, where the organic solvent may be either methanol or ethanol.

The mix of starting materials may be fired by numerous techniques known in the art. A heater such as an electric furnace or gas furnace may be used for the firing. The heater is not limited to any particular type, as long as the starting material mix is fired at the desired temperature for the desired length of time. In some embodiments, firing temperatures may range from about 800 to 1600° C. The firing time may range from about 10 minutes to 1000 hours. The firing atmosphere may be selected from among air, a low-pressure atmosphere, a vacuum, an inert-gas atmosphere, a nitrogen atmosphere, an oxygen atmosphere, an oxidizing atmosphere, and/or a reducing atmosphere. Since $Eu^{2+}$ ions need to be included in the phosphor at some stage of the firing, it is desired in some embodiments to provide a reducing atmosphere using a mixed gas of nitrogen and hydrogen.

Illustrative methods of preparing the present phosphors include a sol-gel method and a solid reaction method. The sol-gel method may be used to produce powder phosphors. A typical procedure comprised the steps of:

1. a) Dissolving certain amounts of alkaline earth nitrates (Mg, Ca, Sr and/or Ba), and $Eu_2O_3$ and/or $BaF_2$ or other alkaline earth metal halides in dilute nitric acid; and b) Dissolving corresponding amount of silica gel in de-ionized water to prepare a second solution.
2. After the solids of the two solutions of steps 1a) and 1b) above were totally dissolved, the two solutions were mixed and stirred for two hours. Ammonia was then used to generate a gel in the mixture solution. Following formation of the gel, the pH was adjusted to about 9.0, and the gelled solution stirred continuously at about 60° C. for 3 hours.
3. After drying the gelled solution by evaporation, the resulted dry gel was decomposed at 500 to 700° C. for about 60 minutes to decompose and acquire oxides.
4. After cooling and grinding with certain amount of $NH_4F$ or other ammonia halides when alkaline earth metal halides are not used in step 1a), the powder was sintered in a reduced atmosphere for about 6 to 10 hours. The calcining/sintering temperature ranged from about 1200 to 1400° C.

In certain embodiments, the solid reaction method was also used for silicate-based phosphors. The steps of a typical procedure used for the solid reaction method can include the following:

1. Desired amounts of alkaline earth oxides or carbonates (Mg, Ca, Sr and/or Ba), dopants of $Eu_2O_3$ and/or $BaF_2$ or other alkaline earth metal halides, corresponding $SiO_2$ and/or $NH_4F$ or other ammonia halides were wet mixed with a ball mill.
2. After drying and grinding, the resulting powder was calcined/sintered in a reduced atmosphere for about 6 to 10 hours. The calcining/sintering temperature ranged from 1200 to 1400° C.

In a specific example relating to the preparation of the present phosphors, the concentration of fluorine in the sintered phosphor $[(Sr_{1-x}Ba_x)_{0.98}Eu_{0.02}]_2SiO_{4-y}F_y$ was measured using secondary ion emission spectroscopy (SIMS), and the results are shown in FIG. 13. In this experiment, the fluorine was added to the phosphor as $NH_4F$. The results show that for a mol % of fluorine of about 20 mol % in the starting material, the sintered phosphor ends up with about 10 mol %. When the content of fluorine in the raw material is about 75 mol %, the content of fluorine in the sintered phosphor is about 18 mol %.

Production of White Light and "Single Colored" Illumination

Figure 1B:
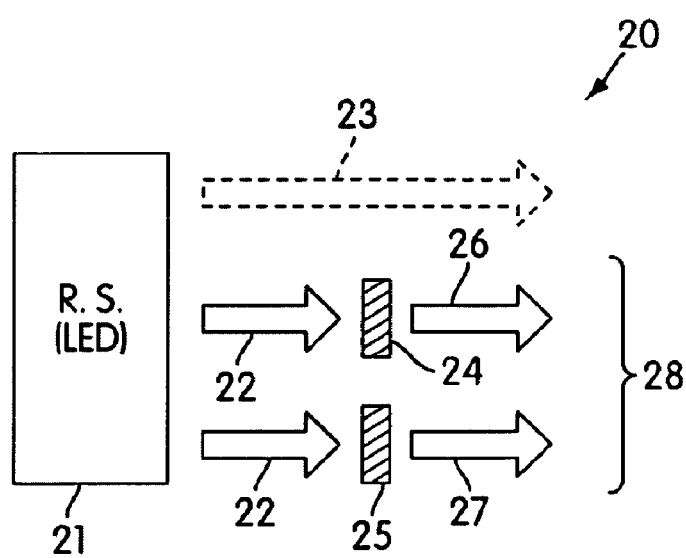
FIG. 1B is a schematic representation of an illumination system comprising a radiation source that emits in the non-visible such that the light coming from the radiation source does not contribute substantially to the light produced by the illumination system.

The white light illumination and illumination that comprises a substantially single color that may be produced using the inventive, novel orange phosphor will be discussed in this final portion of the disclosure. The first section of this final portion will begin with a description of illustrative blue LED's that may be used to excite the inventive orange phosphors. That the present orange phosphors are capable of absorbing, and can be excited by, light over a large range of wavelengths, including the blue portion of the visible, is demonstrated by the excitation spectra of FIG. 3. According to the general scheme of FIG. 1A, light from the inventive orange phosphor may be combined with light from the blue LED to make white illumination. Alternatively, as shown in FIG. 1B, light from the inventive orange phosphor (excited by light from a non-visible UV excitation source) may be combined with light from another phosphor, such as, for example, a yellow or green phosphor. Thus, the color rendering of the white light may be adjusted with the inclusion of other phosphors in the system.

The UV and Blue LED Radiation Sources

In certain embodiments, the blue light emitting LED emits light having a main emission peak in the wavelength range greater than or equal to about 400 nm, and less than or equal to about 520 nm. This light serves two purposes: 1) it provides the excitation radiation to the phosphor system, and 2) it provides blue light which, when combined with the light emitted from the phosphor system, makes up the white light of the white light illumination.

In certain embodiments, the blue LED emits light greater than or equal to about 420 nm, and less than or equal to about 500 nm. In yet another embodiment, the blue LED emits light greater than or equal to about 430 and less than or equal to about 480 nm. The blue LED wavelength may be 450 nm. In yet another embodiment, the radiation source is configured to emit radition having a wavelength ranging from about 280 560 nm.

The blue light emitting device of the present embodiments is herein described generically as a "blue LED," but it will be understood by those skilled in the art that the blue light emitting device may be at least one of (wherein it is contemplated to have several operating simultaneously) a blue light emitting diode, a laser diode, a surface emitting laser diode, a resonant cavity light emitting diode, an inorganic electroluminescence device and an organic electroluminescence device. If the blue light emitting device is an inorganic device, it may be a semiconductor selected from the group consisting of a gallium nitride based compound semiconductor, a zinc selenide semiconductor and a zinc oxide semiconductor.

In alternative embodiments, the novel orange phosphors are excited by a radiation source emitting at wavelengths substantially less than 400 nm. Such a radiation source that emits substantially non-visible light may be a UV LED, or any of the other types of radiation sources listed above for the blue LED.

FIG. 3 is an excitation spectrum of the present orange/red phosphors, showing that these novel phosphors are capable of absorbing radiation over a range of about 280 to 560 nm.

The Inventive Orange Phosphor in Combination with Other Phosphors

In one embodiment of the present invention, a white illumination device can be constructed using a GaN based blue LED having a emission peak wavelength ranging about 430 nm to 480 nm, and the inventive orange phosphor with an emission peak wavelength greater than about 590 to 600 nm in combination with other phosphors. It will be understood by those skilled in the art that light emitted from the present orange phosphors may be combined with light from a visible blue radiation source, or light from a blue, green, or yellow phosphor, among other phosphors.

Examples of blue phosphors that may be used in keeping with the above concept have been described in a U.S. patent application Ser. No. 11/173,342, titled "Aluminate-based blue phosphors," filed Jul. 1, 2005, by inventors Ning Wang, Yi Dong, Shifan Cheng, and Yi-Qun Li, the application assigned to Intematix Corporation of Fremont, Calif. Of course, virtually any blue phosphor may be appropriate for this application, including commercial BAM phosphors, but the Intematix phosphors work particularly well. These phosphors may be described by the generalized formula $(M_{1-x}Eu_x)_{2-z}Mg_zAl_yO_{[1+(3/2)y]}$, where M is at least one of Ba or Sr. These blue phosphors may emit at wavelengths ranging from about 420 to 560 nm.

Figure 12:
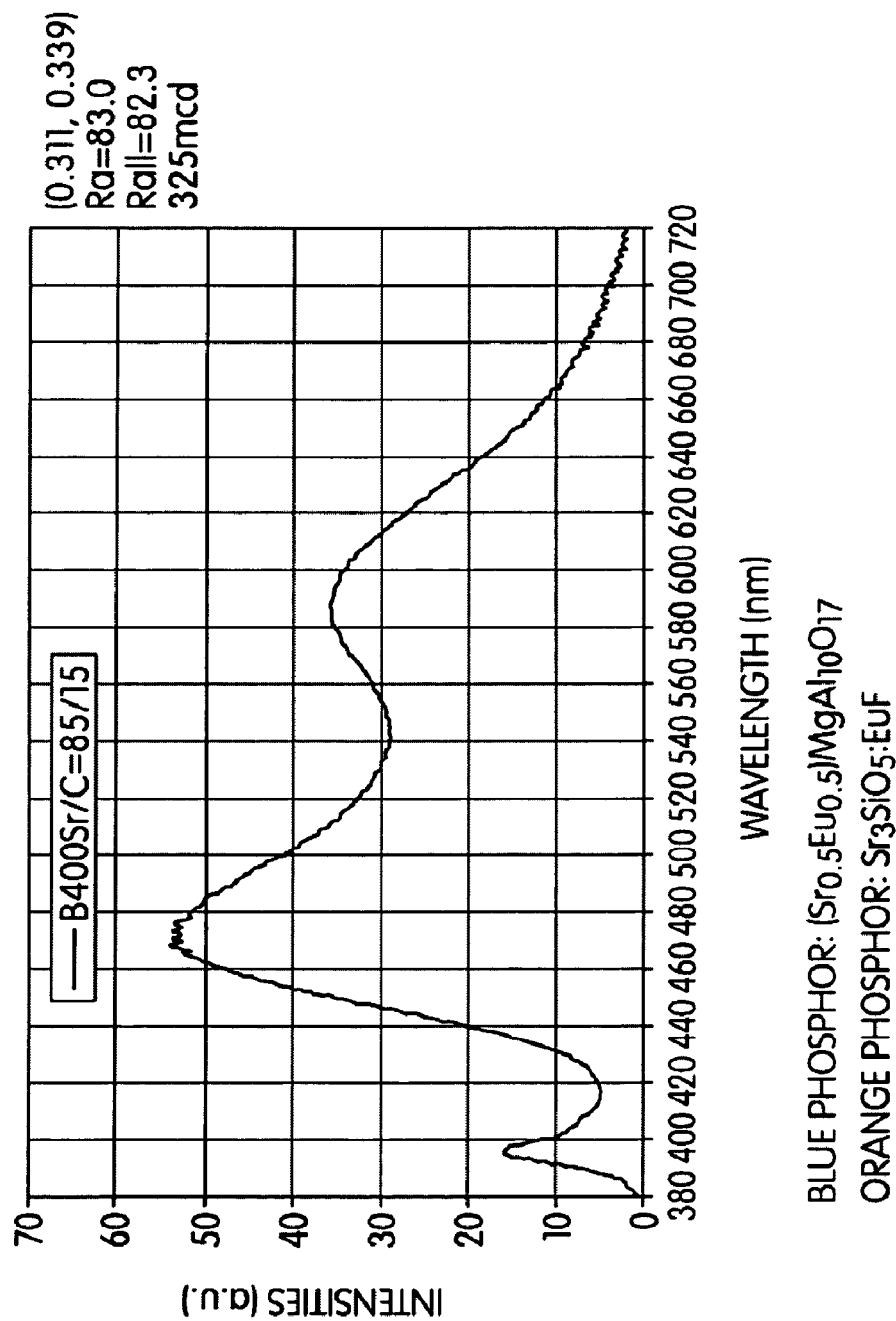
FIG. 12 is a graph of the emission intensity of a white light LED illumination system comprising an orange phosphor of the present embodiments and a blue phosphor, the orange phosphor having the formula $Sr_3SiO_5:Eu^{2+}F$ and the blue phosphor having the formula $(Sr_{0.5}Eu_{0.5})MgAl_{10}O_{17}$; this phosphor package being UV excited by a an LED chip emitting at 395 nm (thus, corresponding to the configuration depicted in FIG. 1B)

An example of the white light that may be obtained from a combination of the present orange phosphors and the blue phosphors described in the above-mentioned application (excited by a non-visible, UV LED providing excitation radiation at 395 nm) is shown in FIG. 12. This white light was produced by an orange phosphor having the formula $Sr_3SiO_5$:$Eu^{2+}$F, in combination with a blue phosphor having the formula $(Sr_{0.5}Eu_{0.5})MgAl_{10}O_{17}$. The white light thus produced demonstrated an Ra of 83.0 and an Rall of 82.3.

Alternatively, the present orange phosphors may be used in combination with a yellow phosphor (with or without blue light from a blue LED excitation source; and with or without a blue phosphor, green phosphor, red phosphor, etc.) such as those commercially available yellow phosphors (e.g., a YAG:Ce phosphor), or a yellow phosphor in keeping with concepts described in a patent application titled "Novel silicate based yellow-green phosphors," U.S. Pat. No. 7,311,858, filed Sep. 22, 2004, by inventors Ning Wang, Yi Dong, Shifan Cheng, and Yi-Qun Li. Of course, virtually any yellow phosphor may be appropriate for this application. These phosphors may be described by the generalized formula $A_2SiO_4$:$Eu^{2+}$D, where A is at least one divalent metal selected from the group consisting of Sr, Ca, Ba, Mg, Zn, and Cd, and D is a dopant selected from the group consisting of F, Cl, Br, I, P, S, and N. These phosphors may alternatively be written as $A_2Si(O,D)_4$:$Eu^{2+}$, showing that the D dopant resides on oxygen lattice sites in the host crystal, and is not positioned on silicon lattice sites. They are configured to emit light having a wavelength ranging from about 530 to 590 nm.

Alternatively, the present orange phosphors may be used in combination with a green phosphor (with or without blue light from a blue LED excitation source; and with or without a blue phosphor, yellow phosphor, red phosphor, etc.), including commercially available green phosphors. Also appropriate are green phosphors described in a U.S. patent application Ser. No. 11/036,914, titled "Novel aluminate based green phosphors," filed Jan. 14, 2005, by inventors Ning Wang, Yi Dong, Shifan Cheng, and Yi-Qun Li. Of course, virtually any green phosphor may be appropriate for this application. These phosphors may be described by the generalized formula $M_{1-x}Eu_xAl_yO_{[1+(3/2)y]}$, wherein M is at least one divalent metal selected from the group consisting of Sr, Ca, Ba, Mg, Mn, Zn, Cu, Sm, Tm, and Cd. These phosphors are configured to emit light having a wavelength ranging from about 500 to 550 nm.

Also appropriate are novel green silicate-based phosphors developed by the present inventors: these silicate-based green phosphors may be described either by the formula $(Sr,A_1)_x(Si,A_2)(O,A_3)_{2+x}$:$Eu^{2+}$, where $A_1$, $A_2$, and $A_3$ have the same meaning as for the orange phosphors, and x has the same range of values. In other words, silicate-based green phosphors that may be used in conjunction with the novel silicate-based orange phosphors share the same general formula by making adjustments in the choice and relative amounts of $A_1$, $A_2$, and $A_3$. Alternatively, the green silicate-based phosphors may have the formula $(Sr,A_1)_y(Si,A_2)(O,A_3)_{2+y}$:$Eu^{2+}$ where $A_1$, $A_2$, and $A_3$ are the same elements as for the orange phosphor, and y is any value between 1.5 and 2.5, inclusive.

Figure 14:
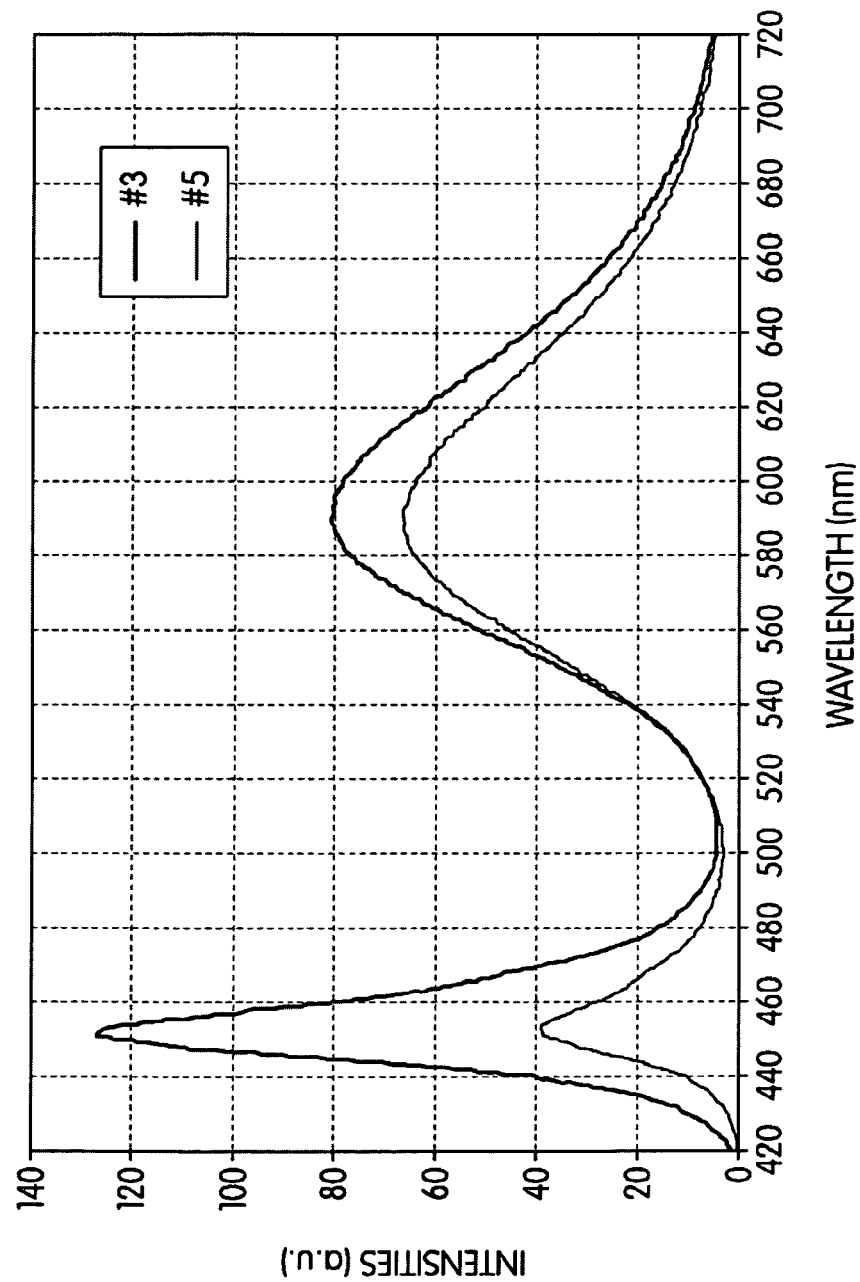
FIG. 14 is a collection of emission spectra for two different colored LEDs, comprising the present orange phosphors in combination with other phosphors as explained by the table in FIG. 13, and excited at 450 nm (in contrast to the UV excitation of FIG. 12)
Figure 15:
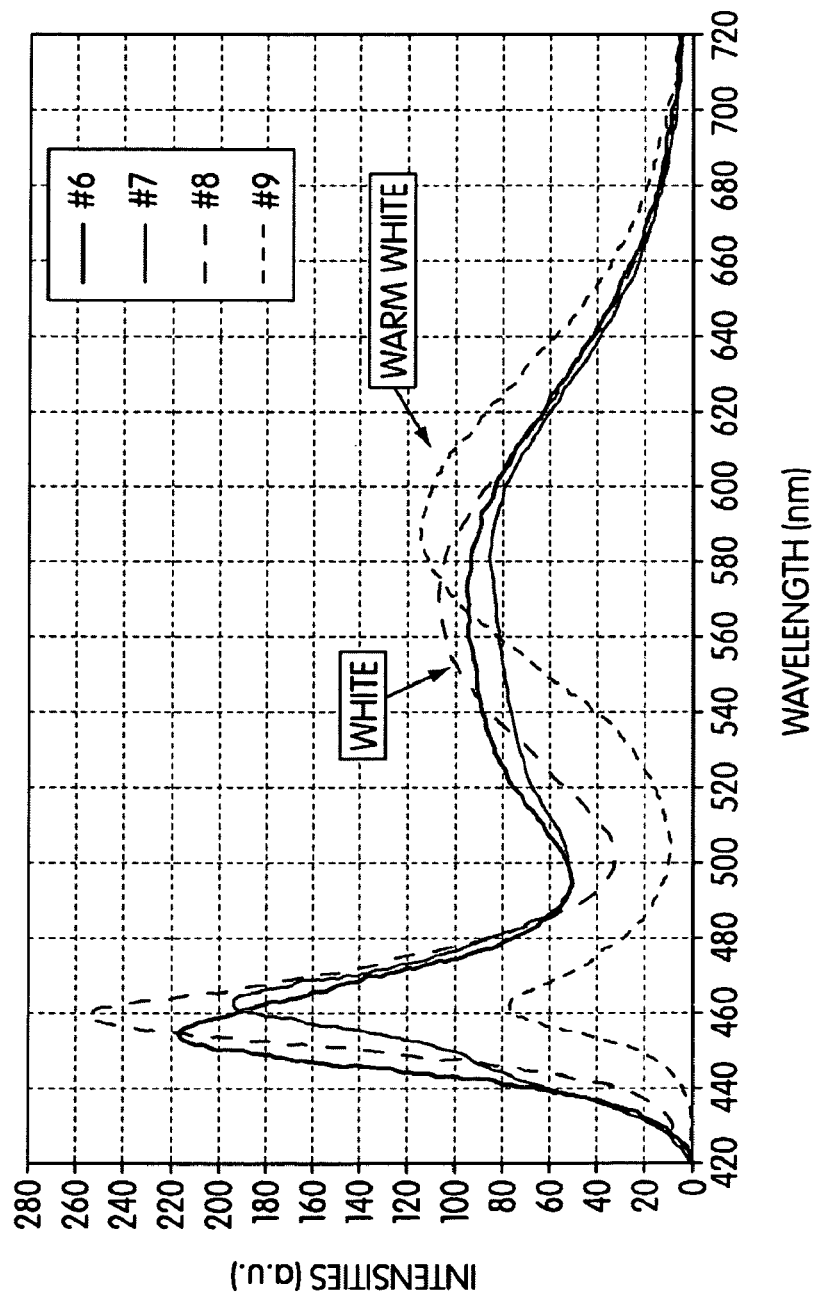
FIG. 15 is a collection of emission spectra for several different white LEDs, the combinations of phosphors again by the table in FIG. 13, and the excitations being at either 450 nm or 460 nm.

Further examples of the use of the present silicate-based orange phosphors in combination with green and yellow phosphors to make white LEDs, and other colored LEDs, are shown in FIGS. 13, 14, and 15. FIG. 13 is a table showing how an exemplary orange phosphor was combined in various ways with a green phosphor, or with one of two yellow phosphors. The orange phosphor used in these experiments was $(Sr_{0.9}Ba_{0.1})_3SiO_5$:$Eu^{2+}$F, labeled as composition "C" in the table. The green phosphor was $(Ba_{0.7}Sr_{0.3})_2SiO_4$:$Eu^{2+}$F, labeled as composition "G2" in the table. The two yellow phosphors used in this experiment were $(Ba_{0.3}Sr_{0.7})_2SiO_4$:$Eu^{2+}$F, labeled as composition "A" in the table, and $(Ba_{0.075}Mg_{0.025}Sr_{0.9})_2SiO_4$:$Eu^{2+}$F, labeled as composition "B" in the table of FIG. 13.

Samples #1 to #9 of FIG. 13 combine the phosphors A, B, C, and G2 in various ways. For example, the phosphors of sample #1 are a combination of about 95% by weight of the B phosphor, and 5% by weight of the C phosphor. The phosphors are excited by a 540 nm blue LED, and since this is visible blue light, the resulting overall illumination from this sample is from the blue LED, the B yellow phosphor, and the C orange phosphor.

Optical results are shown in FIGS. 14 and 15. Referring to FIG. 14, one skilled in the art may see that an LED may be fabricated that has orange and yellow components, thus producing a somewhat pink colored LED. This is demonstrated by samples #3 and #5, which have 62 and 38 percent by weight of the B and C phosphors (sample #3), and 78 and 22 percent by weight (sample #5), respectively.

Results for white light illumination systems are shown in FIG. 15 for samples #6, #7, #8, and #9. Here, it may be seen that the color rendering may be adjusted by varying the relative amounts of the orange phosphor in combination with the green phosphor. Samples #6 and #7, for example, demonstrate a color rendering Ra of greater than 80 in combinations of 15/85 percent by weight of orange to green (sample #6), and 22/78 percent by weight of orange to green, respectively.

Many modifications of the illustrative embodiments of the invention disclosed above will readily occur to those skilled in the art. Accordingly, the invention is to be construed as including all structure and methods that fall within the scope of the appended claims.

What is claimed is:

1. A silicate-based orange phosphor having the formula $(Sr_{1-x}M_x)_yEu_zSiO_5$, wherein:

M is at least one of a divalent metal selected from the group consisting of Ba, Mg, Ca, and Zn;

$0 < x \leq 0.5$;

$2.6 \leq y \leq 3.3$; and $0.001 \leq Z \leq 0.5$;

wherein the phosphor is configured to emit visible light having a peak emission wavelength greater than about 565 nm;

subject to the proviso that y is not 3 when M is Ba.

2. The silicate-based orange phosphor of claim 1, wherein the phosphor has the formula $(Ba_{0.05}Mg_{0.05}Sr_{0.9})_{2.7}Eu_zSiO_5$.

3. The silicate-based orange phosphor of claim 1, wherein the phosphor has the formula $(Ba_{0.075}Mg_{0.025}Sr_{0.9})_3Eu_zSiO_5$.

4. The silicate-based orange phosphor of claim 1, wherein the phosphor has the formula $(Ba_{0.05}Mg_{0.05}Sr_{0.9})_3Eu_zSiO_5$.

5. A silicate-based orange phosphor having the formula $(Mg_xSr_{1-x})_yEu_zSiO_5$, wherein:
   $0 < x < 1.0$;
   $2.6 \leq y \leq 3.3$; and
   y+z is about equal to 3.

6. The silicate-based orange phosphor of claim 5, wherein the phosphor has the formula $(Mg_xSr_{1-x})_{2.91}Eu_{0.09}SiO_5$.

7. A silicate-based orange phosphor having the formula $(Ca_xSr_{1-x})_yEu_zSiO_5$, wherein:
   $0 < x < 1.0$;
   $2.6 \leq y \leq 3.3$; and
   y+z is about equal to 3.

8. The silicate-based orange phosphor of claim 7, wherein the phosphor has the formula $(Ca_xSr_{1-x})_{2.91}Eu_{0.09}SiO_5$.

9. A silicate-based orange phosphor having the formula $(Ba_xSr_{1-x})_yEu_zSiO_5$, wherein:
   $0 < x < 1.0$;
   $2.6 \leq y \leq 3.3$; and
   y+z is about equal to 3; and subject to the proviso that y is not 3.

10. The silicate-based orange phosphor of claim 9, wherein the phosphor has the formula $(Ba_xSr_{1-x})_{2.91}Eu_{0.09}SiO_5$.

11. A silicate-based orange phosphor having the formula $(M_{1-x}Eu_x)_ySiO_5(F, Cl, Br)$, wherein:
   M is at least one of a divalent metal selected from the group consisting of Sr, Ca, Ba, Zn, and Mg;
   $0.01 \leq x \leq 0.01$; and
   $2.6 \leq y \leq 3.3$.

12. The silicate-based phosphor of claim 11, wherein M is Sr.

13. The silicate-based phosphor of claim 11, wherein the halogen is F.

14. A silicate-based orange phosphor having the formula $(M_{1-x}Eu_x)_ySiO_5(F,Cl,Br)_{6z}$, wherein:
   M is at least one of a divalent metal selected from the group consisting of Sr, Ca, Ba, Zn, and Mg;
   $0.01 \leq x \leq 0.1$;
   $2.6 \leq y \leq 3.3$; and
   $0 < z \leq 0.1$.

15. The silicate-based phosphor of claim 14, wherein M is Sr.

16. The silicate-based phosphor of claim 14, wherein the halogen is F.

17. A white LED comprising:
   a radiation source configured to emit radiation having a wavelength ranging from about 280 to 560 nm; and
   a silicate-based orange phosphor configured to absorb at least a portion of the radiation from the radiation source and emit light with a peak intensity in a wavelength greater than about 565 nm;
   wherein the orange phosphor has the formula $(Sr_{1-x}M_x)_yEu_zSiO_5$;
   M is at least one of a divalent metal selected from the group consisting of Ba, Mg, Ca, and Zn;
   $0 < x \leq 0.5$;
   $2.6 \leq y \leq 3.3$; and
   $0.001 \leq z \leq 0.5$;
   subject to the proviso that y is not 3 when M is Ba.

18. The white LED of claim 17, further including a green phosphor configured to absorb at least a portion of the radiation from the radiation source and emit light with a peak intensity in a wavelength ranging from about 500 to 550 nm.

19. The white LED of claim 17, further including a blue phosphor configured to absorb at least a portion of the radiation from the radiation source, and emit light with a peak intensity in a wavelength ranging from about 420 to 560 nm.

20. The white LED of claim 17, further including a yellow phosphor configured to absorb at least a portion of the radiation from the radiation source, and emit light with a peak intensity in a wavelength ranging from about 530 to 590 nm.

21. An orange LED comprising:
   a radiation source configured to emit radiation having a wavelength ranging from about 280 to 560 nm; and
   a silicate-based orange phosphor configured to absorb at least a portion of the radiation from the radiation source and emit light with a peak intensity in a wavelength greater than about 565 nm;
   wherein the orange phosphor has the formula $(Sr_{1-x}M_x)_yEu_zSiO_5$;
   M is at least one of a divalent metal selected from the group consisting of Ba, Mg, Ca, and Zn;
   $0 < x \leq 0.5$;
   $2.6 \leq y \leq 3.3$; and
   $0.001 \leq z \leq 0.5$;
   subject to the proviso that y is not 3 when M is Ba.

22. An orange LED comprising:
   a radiation source configured to emit radiation having a wavelength ranging from about 280 to 560 nm; and
   a silicate-based orange phosphor having the formula $(M_{1-x}Eu_x)_ySiO_5:F,Cl,Br$, wherein:
   M is at least one of a divalent metal selected from the group consisting of Sr, Ca, Ba, Zn, and Mg;
   $0.01 \leq x \leq 0.1$; and
   $2.6 \leq y \leq 3.3$.

23. A method of preparing a silicate-based orange phosphor having the formula $(Sr_{1-x}M_x)_yEu_zSiO_5$ wherein:
   M is at least one of a divalent metal selected from the group consisting of Ba, Mg, Ca, and Zn;
   $0 < x \leq 0.5$;
   $2.6 \leq y \leq 3.3$; and
   $0.001 \leq z \leq 0.5$;
   the method selected from the group consisting of a sol-gel method, a solid reaction method, and a co-precipitation method;
   subject to the proviso that y is not 3 when M is Ba, when the method is a solid reaction method.

24. The method of claim 23, wherein the method is a co-precipitation method.

25. A method of preparing a silicate-based orange phosphor having the formula $(M_{1-x}Eu_x)_ySiO_5(F,Cl,Br)\ H_{6z}$, wherein:
   M is at least one of a divalent metal selected from the group consisting of Sr, Ca, Ba, Zn and Mg;
   $0.01 \leq x \leq 0.1$;
   $2.6 \leq y \leq 3.3$; and
   $0 < z \leq 0.1$;
   the method selected from the group consisting of a sol-gel method, a solid reaction method, and a co-precipitation method.

26. The method of claim 25, wherein the method is a co-precipitation method.

* * * * *

UNITED STATES PATENT AND TRADEMARK OFFICE
CERTIFICATE OF CORRECTION

PATENT NO. : 7,655,156 B2
APPLICATION NO. : 11/258679
DATED : February 2, 2010
INVENTOR(S) : Cheng et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 479 days.

Signed and Sealed this

Twenty-third Day of November, 2010

David J. Kappos
*Director of the United States Patent and Trademark Office*